(12) United States Patent
Kim et al.

(10) Patent No.: US 9,594,673 B2
(45) Date of Patent: Mar. 14, 2017

(54) DRIVING METHOD OF MEMORY CONTROLLER AND NONVOLATILE MEMORY DEVICE CONTROLLED BY MEMORY CONTROLLER

(71) Applicant: SAMSUNG ELECTRONICS CO., LTD., Suwon-si, Gyeonggi-Do (KR)

(72) Inventors: Kyungryun Kim, Seoul (KR); Seokjun Ham, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 74 days.

(21) Appl. No.: 14/523,978

(22) Filed: Oct. 27, 2014

(65) Prior Publication Data

US 2015/0135025 A1   May 14, 2015

(30) Foreign Application Priority Data

Nov. 13, 2013   (KR) ........................ 10-2013-0137833

(51) Int. Cl.
| | |
|---|---|
| *G06F 12/02* | (2006.01) |
| *G06F 11/10* | (2006.01) |
| *G11C 29/52* | (2006.01) |
| *G11C 29/44* | (2006.01) |

(52) U.S. Cl.
CPC ...... *G06F 12/0246* (2013.01); *G06F 11/1048* (2013.01); *G06F 2212/7211* (2013.01); *G11C 29/52* (2013.01); *G11C 2029/4402* (2013.01)

(58) Field of Classification Search
CPC ...... G06F 11/07; G06F 11/08; G06F 11/1068; G06F 11/076; G06F 11/107; G06F 12/02; G06F 12/0246; G06F 12/0238; G06F 12/0802; G06F 12/0804; G06F 12/10; G06F 13/00; G06F 2212/7211; G11C 29/52; G11C 2029/0411; G11C 29/76; G11C 16/349; G11C 16/3495; G11C 16/06; G11C 11/5621; G11C 2211/5641
See application file for complete search history.

(56) References Cited

U.S. PATENT DOCUMENTS

| | | | |
|---|---|---|---|
| 7,120,773 B2 | 10/2006 | Yoshioka et al. | |
| 7,653,778 B2 | 1/2010 | Merry, Jr. et al. | |
| 8,453,021 B2 | 5/2013 | Moshayedi et al. | |
| 8,966,343 B2* | 2/2015 | Syu ..................... | G11C 16/349 365/185.09 |
| 9,262,261 B2* | 2/2016 | Radke ................. | G06F 11/1068 |

(Continued)

FOREIGN PATENT DOCUMENTS

| | | |
|---|---|---|
| JP | 2012212312 A | 11/2012 |
| KR | 1020090027952 A | 3/2009 |

(Continued)

*Primary Examiner* — April Y Blair
*Assistant Examiner* — Neeta Darnule
(74) *Attorney, Agent, or Firm* — Volentine & Whitt, PLLC

(57) ABSTRACT

A method is for driving a memory controller which is configured to control a nonvolatile memory device. The method includes counting a number of error bits of read data provided from the nonvolatile memory device, determining a running average value using the number of error bits; and performing a wear leveling on the nonvolatile memory device using the running average value as a wear leveling index.

17 Claims, 19 Drawing Sheets

(56) References Cited

U.S. PATENT DOCUMENTS

| | | | |
|---|---|---|---|
| 2008/0279005 A1* | 11/2008 | France | G06F 12/0246 365/185.11 |
| 2009/0077429 A1* | 3/2009 | Yim | G06F 12/0246 714/54 |
| 2009/0276570 A1* | 11/2009 | Cheng | G06F 11/3419 711/115 |
| 2010/0115192 A1 | 5/2010 | Lee | |
| 2010/0196901 A1 | 8/2010 | Yamamoto et al. | |
| 2010/0306582 A1* | 12/2010 | Han | G06F 11/1068 714/6.13 |
| 2010/0332923 A1* | 12/2010 | D'Abreu | G06F 11/1068 714/708 |
| 2011/0026616 A1* | 2/2011 | Sestok | H04L 25/0204 375/260 |
| 2011/0246705 A1 | 10/2011 | Mudama et al. | |
| 2011/0252289 A1* | 10/2011 | Patapoutian | G06F 11/1048 714/763 |
| 2011/0320688 A1* | 12/2011 | Lee | G06F 12/0246 711/103 |
| 2012/0221775 A1* | 8/2012 | Kim | G06F 21/00 711/103 |
| 2013/0117600 A1 | 5/2013 | Eleftheriou et al. | |
| 2013/0138870 A1* | 5/2013 | Yoon | G11C 11/5621 711/103 |
| 2013/0346812 A1* | 12/2013 | Bahirat | G11C 16/349 714/704 |
| 2014/0245109 A1* | 8/2014 | Yim | G06F 12/0246 714/773 |
| 2014/0269090 A1* | 9/2014 | Flynn | G11C 16/14 365/185.19 |
| 2015/0067415 A1* | 3/2015 | Miyamoto | G06F 11/073 714/704 |

FOREIGN PATENT DOCUMENTS

| | | |
|---|---|---|
| KR | 1020100050260 A | 5/2010 |
| KR | 101080191 B1 | 10/2011 |
| KR | 1020100062191 A | 6/2013 |
| KR | 1020130060791 A | 6/2013 |

* cited by examiner

DRIVING METHOD OF MEMORY CONTROLLER AND NONVOLATILE MEMORY DEVICE CONTROLLED BY MEMORY CONTROLLER

CROSS-REFERENCE TO RELATED APPLICATIONS

A claim for priority under 35 U.S.C. §119 is made to Korean Patent Application No. 10-2013-0137833 filed Nov. 13, 2013, in the Korean Intellectual Property Office, the entire contents of which are hereby incorporated by reference.

BACKGROUND

The inventive concepts described herein relate to a driving method of a memory controller, and more particularly, inventive concepts relate to a memory controller driving method capable of performing a wear leveling on a nonvolatile memory and to a nonvolatile memory device controlled by a memory controller.

A semiconductor memory device may be generally classified as either volatile or nonvolatile. Volatile memory devices are characterized by the loss of stored data upon a power-off condition, and examples thereof include dynamic random access memory (DRAM) and static random access memory (SRAM). On the other hand, nonvolatile memory devices are characterized by the retention of stored data upon a power-off condition, and examples thereof include read only memory (ROM), electrically erasable programmable ROM (EEPROM), and flash memory. Among nonvolatile memory, flash memory device in particular considers to exhibit advantages of relatively fast read speeds, low power consumption, and mass storage capacity.

To efficiently manage file data and to improve system performance, a memory system including a nonvolatile memory may store data in a buffer area before storing it in a user area. This program technique may be advantageous to reduce the number of merge operations or the number of block-erase operations. However, a space of the buffer area may be insufficient in the case of an increase in the size of file data to be stored, and a performance of a memory system may be degraded as a result of frequent transfers of the file data between the buffer area and the user area. Also, a wear level of the buffer area may be sharply increased as compared with the user area.

SUMMARY

One aspect of embodiments of the inventive concept is directed to provide a method of driving a memory controller which is configured to control a nonvolatile memory device, the method comprising counting a number of error bits of read data provided from the nonvolatile memory device, determining a running average value using the number of error bits, and performing a wear leveling on the nonvolatile memory device using the running average value as a wear leveling index.

The running average value may be determined in accordance with a noise parameter. When the running average value is less than a reference value, a wear leveling operation on the nonvolatile memory device may be performed in a direction where a program or erase frequency is increased. When the running average value is greater than a reference value, a wear leveling operation on the nonvolatile memory device may be performed in a direction where a program or erase frequency is decreased.

Another aspect of embodiments of the inventive concept is directed to provide a nonvolatile memory device comprising a memory cell array including a plurality of memory blocks storing data, a page buffer circuit connected to the memory cell array through bit lines and including a sense latch to sense and store data read from the memory cell array, and control logic configured to control the page buffer circuit. The control logic comprises a wear leveling index former which counts the number of error bits of read data based on the result of a comparison between the read data stored in the sense latch and original data, determines a running average value using the number of error bits, and forms wear leveling indexes of the plurality of memory blocks.

The page buffer circuit may perform an XOR operation using a data latch and the sense latch, and provide a result of the XOR operation to the wear leveling index former. The wear leveling index former may determine the number of error bits by counting the number of one-bits resulting from the XOR operation.

Still another aspect of embodiments of the inventive concept is directed to provide a memory controller comprising a microprocessor configured to control and interpret a program or read command to be provided to a nonvolatile memory device, an ECC decoder configured to count a number of error bits of data read from the nonvolatile memory device under a control of the microprocessor, and a wear leveling control unit configured to determine a running average value using the number of error bits and a noise parameter and to perform a wear leveling of the nonvolatile memory device according to the running average value.

With embodiments of the inventive concepts, it is possible to uniformly program and/or erase a memory block of a nonvolatile memory device by performing a wear leveling operation using a running average value as a wear leveling index. Thus, a life time of the nonvolatile memory device may be extended.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
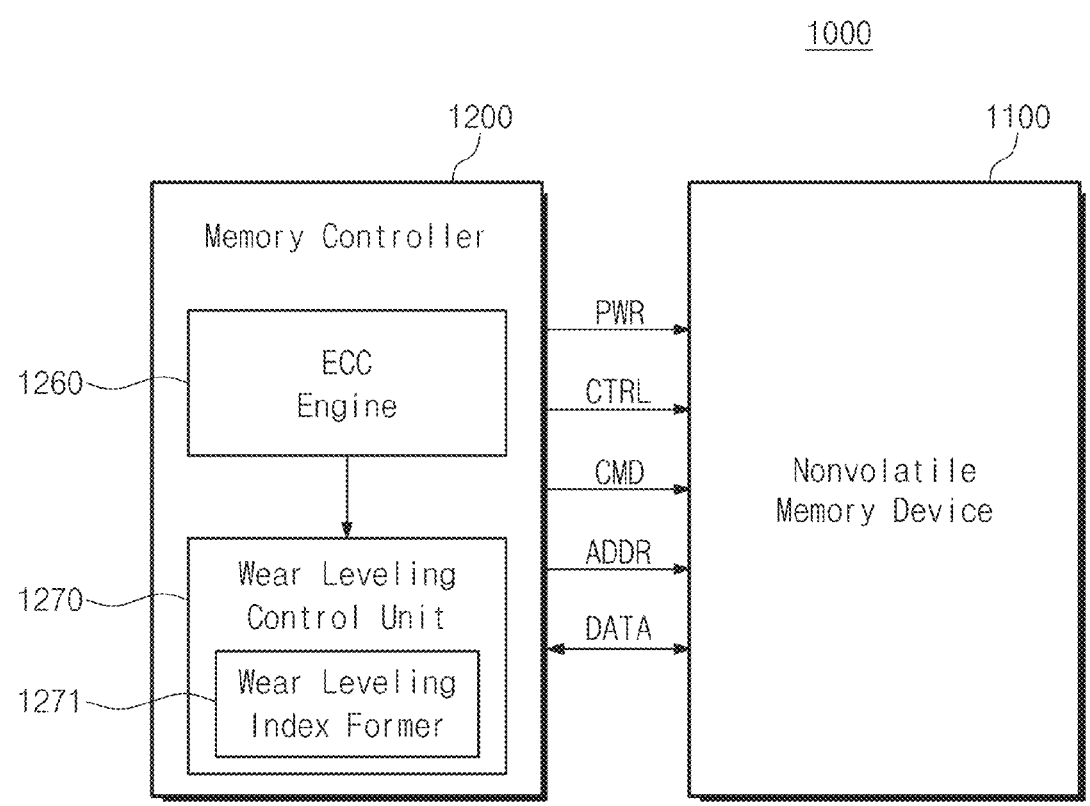
FIG. 1 is a block diagram schematically illustrating a nonvolatile memory system according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory system according to an embodiment of the inventive concept. Referring to FIG. 1, a nonvolatile memory device 1100 may include a nonvolatile memory device 1100 and a memory controller 1200. The nonvolatile memory system 1000 shown in FIG. 1 may include all of the flash memory based data storage medias such as a memory card, a USB memory, a solid state drive (SSD), and so on.

The nonvolatile memory device 1100 may perform an erase, write or read operation according to a control of the memory controller 1200. The nonvolatile memory device 1100 may receive a command CMD, an address ADDR and data DATA through input/output lines. The nonvolatile memory device 1100 may receive a power PWR through a power line and a control signal CTRL through a control line.

The memory controller 1200 may control an overall operation of the nonvolatile memory device 1100. The memory controller 1200 may include an ECC engine 1260 and a wear leveling control unit 1270.

The ECC engine 1260 may count error bits and may correct error bits. The ECC engine 1260 may perform error correction encoding on data to be programmed at the nonvolatile memory device 1100 and may form data to which parity bits are added. The parity bits may be stored at the nonvolatile memory device 1100.

The ECC engine 1260 may count the number of error bits of data read from the nonvolatile memory device 1100 and may perform error correction decoding on the read data. The ECC engine 1260 may determine whether the error correction decoding is successful. The ECC engine 1260 may correct error bits of data using parity bits generated at ECC encoding.

If the number of error bits thus counted exceeds a correctable error bit limit, the ECC engine 1260 may not correct error bits. In this case, the ECC engine 1260 may generate an error correction fail signal.

The ECC engine 1260 may provide the wear leveling control unit 1270 with error bit information of the read data. Here, the read data may be data that is programmed and then is immediately read. The read data may be data that is read under a control of a microprocessor after the data is programmed and a time elapses. The read data may be data which is read when a host provides a read command.

The wear leveling control unit 1270 may manage a wear level of the nonvolatile memory device 1100 by adjusting the number of program/erase cycles. The wear leveling control unit 1270 may be implemented by hardware or software. That is, the wear leveling control unit 1270 may be a chip or a module installed in the memory controller 1200, or it may be connected through an external memory such as a floppy disk, a compact disk, or an USB. Meanwhile, the wear leveling control unit 1270 may be implemented by a form that is capable of being programmed by a user.

The wear leveling control unit 1270 may include a wear leveling index former 1271 that forms a wear leveling index of the nonvolatile memory device 1100. The wear leveling control unit 1270 may provide the wear leveling index former 1271 with the number of error bits of read data provided from the ECC engine 1260.

The wear leveling index former 1271 may calculate a running average value using the number of error bits and a noise parameter. A detailed equation may be described with reference to FIG. 2. The wear leveling control unit 1270 may perform a wear leveling operation of the nonvolatile memory device 1100 using the running average value as a wear leveling index. When the running average value is large, the wear leveling control unit 1270 may decrease a program or erase frequency of the nonvolatile memory device 1100. That is, if the running average value is greater than a reference value, a memory block of the nonvolatile memory device 1100 corresponding to the running average value may be at a state where a wear level is already increased. For this reason, the program or erase frequency may be decreased.

If the running average value is small, the wear leveling control unit 1270 may increase a program or erase frequency of the nonvolatile memory device 1100. That is, if the running average value is less than the reference value, a memory block of the nonvolatile memory device 1100 corresponding to the running average value may be at a state where a wear level is not increased. For this reason, the program or erase frequency may be increased.

The wear leveling control unit 1270 may determine wear levels of memory blocks of the nonvolatile memory device 1100 based on the running average value, so a life time of the nonvolatile memory device 1100 may be predicted.

The wear leveling control unit 1270 may use the running average value as an index of execution of a wear level such that wear levels of memory blocks of the nonvolatile memory device 1100 may become uniform. Since program/erase cycles of all memory blocks are uniformly maintained, a life time of the nonvolatile memory system 1000 may be extended. A wear level of the nonvolatile memory device 1100, in general, may increase in proportion to an increase in a program/erase cycle and an increase in an ECC error rate.

Figure 2:
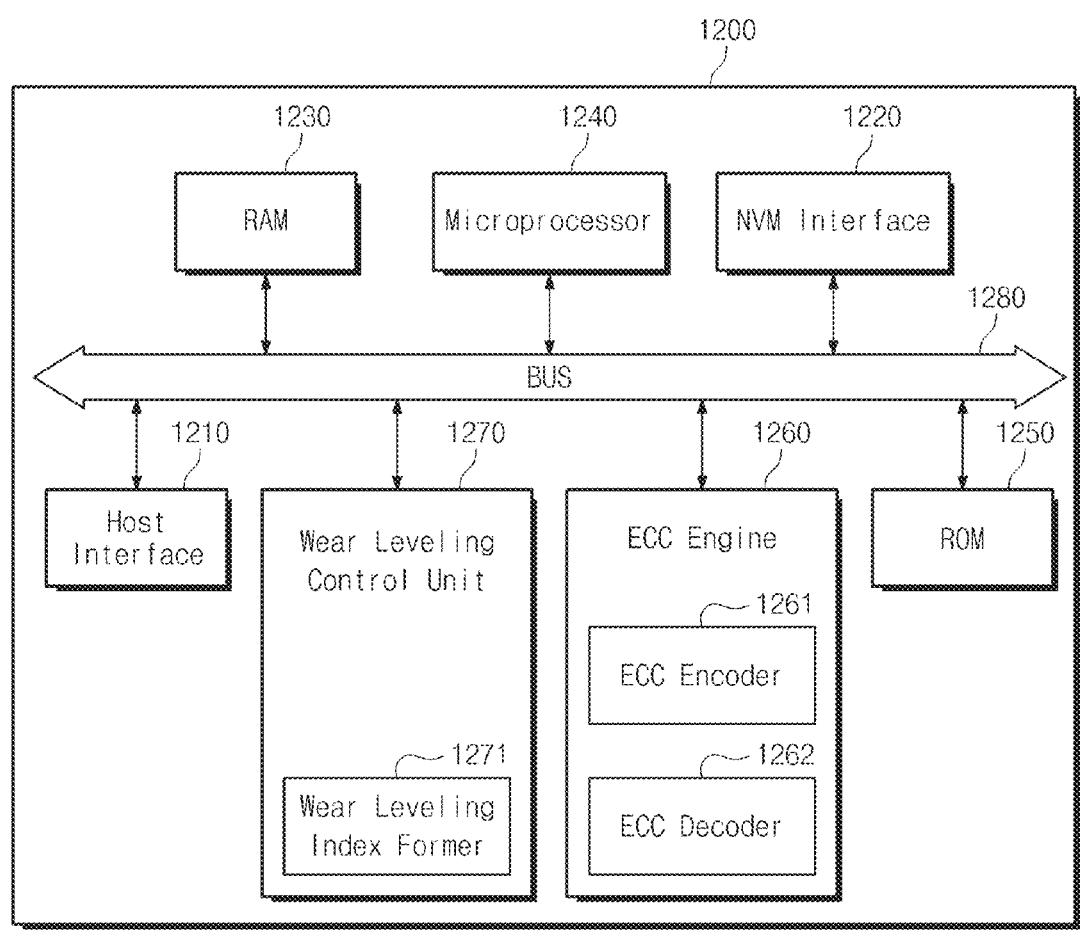
FIG. 2 is a block diagram schematically illustrating a memory controller shown in FIG. 1, according to an embodiment of the inventive concepts.

FIG. 2 is a block diagram schematically illustrating a memory controller shown in FIG. 1, according to an embodiment of the inventive concepts. A memory controller 1200 may include a host interface 1210, a nonvolatile memory interface 1220, a RAM 1230, a microprocessor 1240, a ROM 1250, an ECC engine 1260, and a wear leveling control unit 1270. The components 1210 to 1270 of the memory controller 1200 may be electrically connected through a bus 1280.

The host interface 1210 may communicate with an external host through USB (Universal Serial Bus), SCSI (Small Computer System Interface), PCI express, ATA, PATA (Parallel ATA), SATA (Serial ATA), SAS (Serial Attached SCSI), and so on. The nonvolatile memory interface 1220 may provide an interface between the memory controller 1200 and the nonvolatile memory device 1100.

The RAM 1230 may be a memory acting as a buffer and may store an initial command input through the host interface 1210, data, various variables, or data output from a nonvolatile memory device 1100. The RAM 1230 may store data exchanged with the nonvolatile memory device 1100 and various parameters and variables.

The microprocessor 1240 may be implemented by a circuit, logic, code, or a combination thereof. The microprocessor 1240 may control an overall operation of a nonvolatile memory system 1000 including the memory controller 1200. If a power is applied to the nonvolatile memory system 1000, the microprocessor 1240 may control an overall operation of the nonvolatile memory system 1000 by driving firmware stored in the ROM 1250 on the RAM 1230. Also, the microprocessor 1240 may interpret a command provided from a host and may control an overall operation of the nonvolatile memory device 1100 according to the interpretation result.

A command the microprocessor 1240 requires is provided to the nonvolatile memory device 1100 through the nonvolatile memory interface 1220, and data may be transferred from the memory controller 1200 to the nonvolatile memory device 1100. Data provided from the nonvolatile memory device 1100 may be provided to the memory controller 1200 through the nonvolatile memory interface 1220.

The ROM 1250 may store firmware codes for driving the nonvolatile memory system 1000 and codes needed for an operation of the memory controller 1200. However, the inventive concepts are not limited thereto. For example, the firmware codes may be stored in various nonvolatile memory devices (e.g., a flash memory device) excepting for the ROM 1250.

Thus, a control or intervention of the microprocessor 1240 may include an intervention of firmware being software driven by the microprocessor 1240 as well as a direct hardware control of the microprocessor 1240.

The ECC engine 1260 may perform error bit correction. Referring to FIG. 2, the ECC engine 1260 may include an ECC encoder 1261 and an ECC decoder 1262.

The ECC encoder 1261 may generate a code word including parity bits through error correction encoding on data to be provided to the nonvolatile memory device 1100. The code word may be stored in the nonvolatile memory device 1100.

The ECC decoder 1262 may count the number of error bits of output data. Based on the counting result, the ECC decoder 1262 may determine whether the error correction decoding is successful. The read data may be sent to the ECC decoder 1262, and the ECC decoder 1262 may correct error bits of data using parity bits. The ECC decoder 1262 may count the number of error bits. If the number of error bits is over a limit, the ECC decoder 1262 may not correct the error bits. The ECC decoder 1262 may count the number of error bits of the read data and may provide the wear leveling control unit 1270 with the number of error bits counted.

The ECC encoder 1262 and the ECC decoder 1262 may perform an error correction using LDPC (Low Density Parity Check) code, BCH code, turbo code, RS (Reed-Solomon) code, convolution code, RSC (Recursive Systematic Code), or coded modulation such as TCM (trellis-coded modulation), BCM (Block coded modulation), etc. However, the inventive concepts are not limited thereto.

The wear leveling control unit 1270 may manage a wear level of the nonvolatile memory device 1100 by adjusting a program/erase cycle. The wear leveling control unit 1270 may be implemented by hardware or software. That is, the wear leveling control unit 1270 may be a chip or a module installed in the memory controller 1200, or it may be connected through an external memory such as a floppy disk, a compact disk, or an USB. Meanwhile, the wear leveling control unit 1270 may be implemented by a form that is capable of being programmed by a user.

The wear leveling control unit 1270 may include a wear leveling index former 1271 that forms a wear leveling index of the nonvolatile memory device 1100. The wear leveling control unit 1270 may provide the wear leveling index former 1271 with the number of error bits of read data provided from the ECC engine 1260. The wear leveling index former 1271 may calculate a running average value using the number of error bits and may form the wear leveling index.

With an embodiment of the inventive concepts, the wear leveling index former 1271 may calculate the running average value using the number of error bits and a noise parameter. The running average value may be calculated by the following equation (1).

$$RA(N) = RA(N-1) \times \frac{M-1}{M} + ECC \times \frac{1}{M} \qquad (1)$$

In the equation (1), 'RA(N)' may indicate an Nth running average value to be calculated at a corresponding program/erase cycle, and 'RN(N−1)' may indicate a (N−1)th running average value. 'ECC' may indicate the number of error bits obtained at a corresponding program/erase cycle, and 'M' may be a noise parameter. Referring to the equation (1), the running average value RA used as a wear leveling index may be decided by the number of error bits and the noise parameter.

If a value of the noise parameter M is large, a width of a deviation of error bits corresponding to a program/erase cycle may be small. For this reason, a reflection rate of the deviation of error bits may be reduced, so a noise of the running average value may be decreased. On the other hand, if a value of the noise parameter M is large, the number of program/erase cycles may be increased. Thus, a speed of tracking a variation in the number of error bits may become slow.

If a value of the noise parameter M is small, a width of a deviation of error bits corresponding to a program/erase cycle may be increased. For this reason, a reflection rate of the deviation of error bits may be increased, so a noise of the running average value may be increased. Thus, the wear leveling index former 1271 may set a noise parameter to a small value at an initial program/erase cycle and to a large value according to an increase in the program/erase cycle.

According to another embodiment of the inventive concepts, the wear leveling index former 1271 may calculate a running average value or an average value using the number of error bits of data that is provided through a plurality of read operations on a word line WLn−1 (refer to FIG. 5) of the nonvolatile memory device 1100. The wear leveling index former 1271 may form a wear leveling index using the average value thus calculated.

According to still another embodiment of the inventive concepts, the wear leveling index former 1271 may calculate a running average value or an average value using the number of error bits of data that is provided from a plurality of word lines having the same program/erase cycle. The wear leveling index former 1271 may form a wear leveling index using the average value thus calculated.

According to still another embodiment of the inventive concepts, the wear leveling index former 1271 may calculate a running average value or an average value using the number of error bits of data that is provided from a plurality of word lines during a plurality of program/erase cycle frequencies. The wear leveling index former 1271 may form a wear leveling index using the average value thus calculated. The wear leveling control unit 1270 may perform a wear leveling on the nonvolatile memory device 1100 using the running average value as a wear leveling index.

If the running average value is large, the wear leveling control unit 1270 may decrease a program or erase frequency of the nonvolatile memory device 1100. If the running average value is greater than a reference value, a memory block of the nonvolatile memory device 1100 corresponding to the running average value may be at a state where a wear level is already increased. Thus, the program or erase frequency may be decreased.

If the running average value is small, the wear leveling control unit 1270 may increase a program or erase frequency of the nonvolatile memory device 1100. If the running average value is less than the reference value, a memory block of the nonvolatile memory device 1100 corresponding to the running average value may be at a state where a wear level is not increased. Thus, the program or erase frequency may be increased.

Here, the reference value may be decided when the nonvolatile memory system 1000 is fabricated. The reference value may be variable according to an increase in a program/erase cycle of the nonvolatile memory device 1100. The reference value may not be a fixed value.

The wear leveling control unit 1270 may determine wear levels of memory blocks of the nonvolatile memory device 1100 based on the running average value, so a life time of the nonvolatile memory device 1100 may be predicted.

The wear leveling control unit 1270 may use the running average value as an index of execution of a wear level such that wear levels of memory blocks of the nonvolatile memory device 1100 may become uniform. Since program/erase cycles of all memory blocks are uniformly maintained, a life time of the nonvolatile memory system 1000 may be extended.

Figure 3:
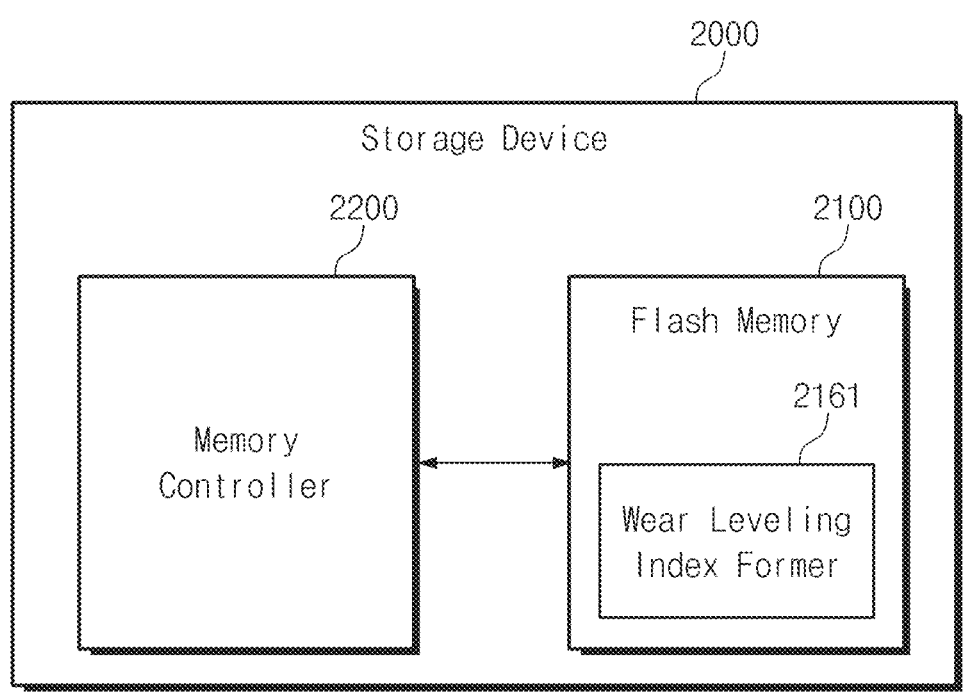
FIG. 3 is a block diagram schematically illustrating a storage device according to another embodiment of the inventive concepts

FIG. 3 is a block diagram schematically illustrating a storage device according to another embodiment of the inventive concepts. Referring to FIG. 3, a storage device 2000 may include a flash memory 2100 and a memory controller 2200. In FIG. 1, there may be shown an example where a wear leveling index former 1271 is included in a memory controller 1200. However, as illustrated in FIG. 3, a wear leveling index former 2161 is included in a nonvolatile memory device such as the flash memory 2100.

Referring to FIG. 3, the flash memory 2100 may include the wear leveling index former 2161. The flash memory 2100 may provide the memory controller 2200 with a wear leveling index formed. The memory controller 2200 may perform a wear leveling on the flash memory 2100 according to the wear leveling index.

The wear leveling index former 2161 may calculate a running average value or an average value using the number of error bits and a noise parameter. The running average value may be calculated as described with reference to FIG. 2.

Figure 4:
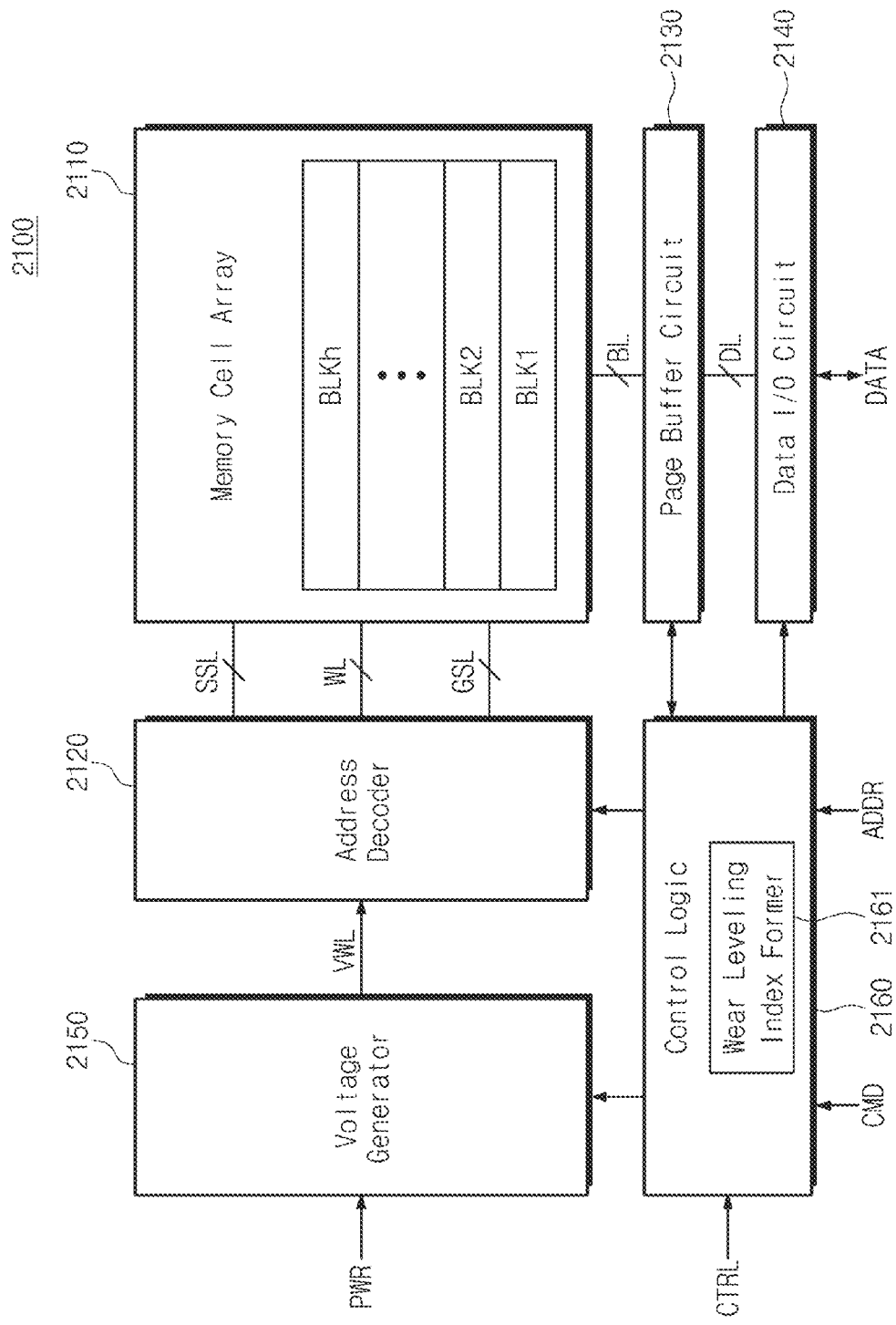
FIG. 4 is a block diagram schematically illustrating a flash memory 2100 shown in FIG. 3, according to an embodiment of the inventive concepts.

FIG. 4 is a block diagram schematically illustrating a flash memory 2100 shown in FIG. 3, according to an embodiment of the inventive concepts. Referring to FIG. 4, a flash memory device 2100 may include a memory cell array 2110, an address decoder 2120, a page buffer circuit 2130, a data input/output circuit 2140, a voltage generator 2150, and control logic 2160.

The memory cell array 2110 may include a plurality of memory blocks. The memory cell array 2110 may be formed to have a planar structure or may be formed to have a three-dimensional structure where memory cells are stacked in a direction perpendicular to a substrate. Each of the memory blocks may include physical pages. Here, a physical page may mean a group of memory cells connected to a word line.

A memory cell may store a single data bit or two or more data bits. A memory cell that stores a single data bit may be referred to as a single level cell (SLC) or a single bit cell, and a memory cell that stores two or more data bits may be referred to as a multi-level cell (MLC) or a multi-bit cell. For example, in case of a 2-bit MLC flash memory device, two logical pages may be stored at one physical page. Here, a logical page may mean a group of data that is simultaneously to be programmed at a physical page.

The address decoder 2120 may be connected to the memory cell array 2110 through selection lines SSL and GSL and word lines WL. At a read operation, the address decoder 2120 may select a word line in response to an address ADDR.

The page buffer circuit 2130 may be connected to the memory cell array 2110 through bit lines BL. A page buffer may be connected to a bit line. This structure may be referred to as the all-bit-line structure. A page buffer may be connected to two or more bit lines. This structure may be referred to as the shield-bit-line structure.

The page buffer circuit 2130 may temporarily store original data to be programmed at a selected page or data read from the selected page. Also, at a read operation, the page buffer circuit 2130 may perform an exclusive OR operation on read data and original data and may provide a result of the exclusive OR operation to a wear leveling index former 2161 of the control logic 2160.

The data input/output circuit 2140 may be connected to the page buffer circuit 2130 through data lines DL and may be connected to a memory controller 2200 (refer to FIG. 3) through input/output lines I/O. The data input/output circuit 2140 may receive program data from the memory controller 2200 at a program operation and may provide read data to the memory controller 2200 at a read operation.

The voltage generator 2150 may receive a power PWR from the memory controller 2200 and may generate a word line voltage VWL needed to read or write data. The word line voltage VWL may be provided to the address decoder 2120.

The control logic 2160 may control read, program, and erase operations of the flash memory device 2100 using a command CMD, an address ADDR, and a control signal CTRL. For example, at a program operation, the control logic 2160 may control the address decoder 2120 such that a read voltage is applied to a selected word line, and it may control the page buffer circuit 2130 and the data input/output circuit 2140 such that data of a selected page is read.

As illustrated in FIG. 4, the control logic 2160 may include the wear leveling index former 2161. The wear leveling index former 2161 may count the number of error bits of read data using a resultant value of the XOR operation provided from the page buffer circuit 2130.

For example, the control logic 2160 may count the number of '1' of the resultant value of the XOR operation from the page buffer circuit 2130 to count the number of error bits of the read data. The wear leveling index former 2161 may calculate a running average value using an error-bit number counted and a noise parameter. The wear leveling index former 2161 may form wear leveling indexes of a plurality of memory blocks using the running average value.

The wear leveling index former 2161 may provide the running average value to the memory controller 2200. The wear leveling index former 2161 may calculate the running average value using the same equation as a wear leveling index former 1271 shown in FIG. 2. The wear leveling index former 2161 may form the wear leveling index in a manner equal to a manner described with reference to FIG. 2.

As above described, if the running average value is greater than a reference value, a memory block of the flash memory 2100 corresponding to the running average value may be at a state where a wear level is already increased. For this reason, a program or erase frequency may be decreased. On the other hand, if the running average value is less than the reference value, a memory block of the flash memory 2100 corresponding to the running average value may be at a state where a wear level is not increased. For this reason, the program or erase frequency may be increased.

The maximum number of program/erase cycles of a memory block may be decided when the flash memory 2100 is fabricated, yet the number of program/erase cycles may be varied according to the running average value.

Figure 5:
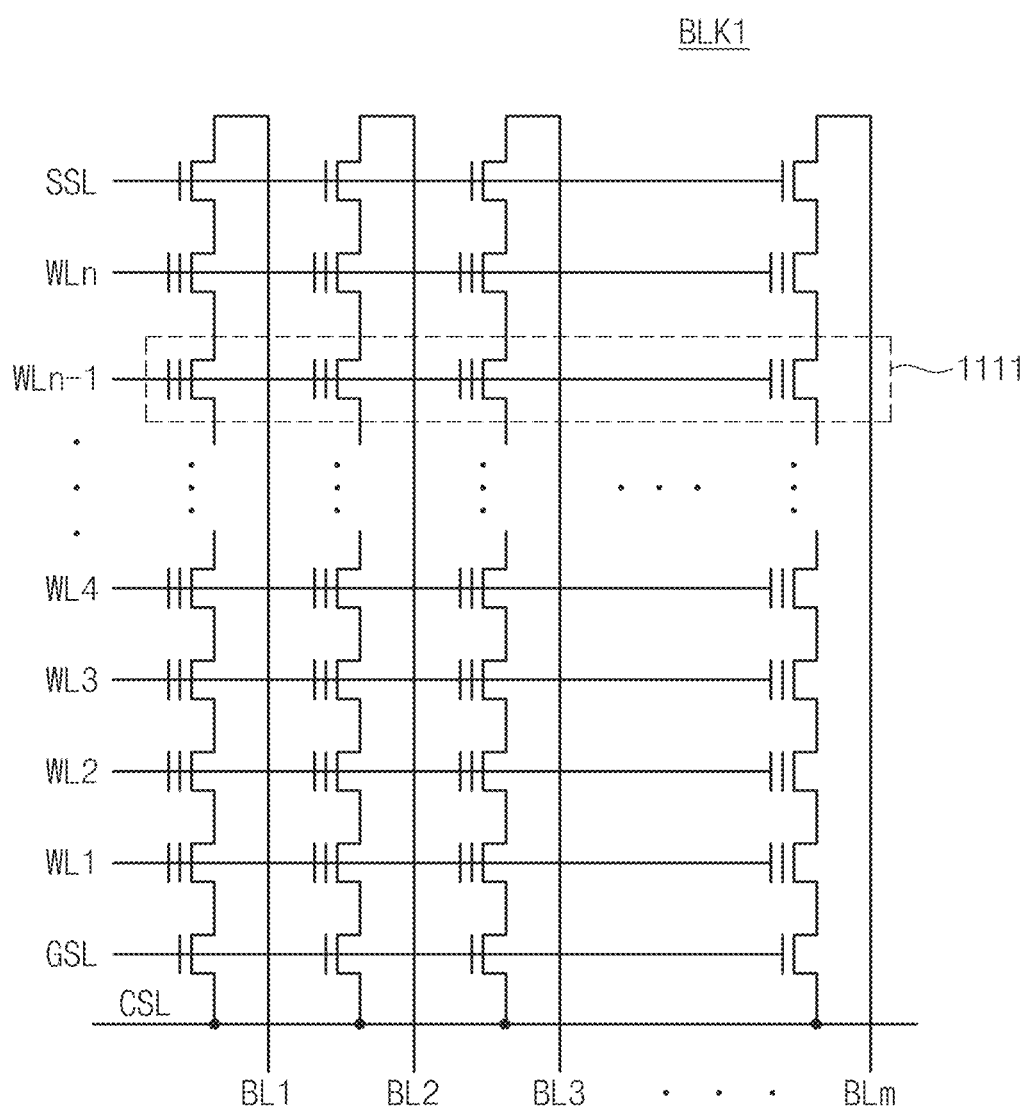
FIG. 5 is a circuit diagram schematically illustrating a memory block of a memory cell array shown in FIG. 4, according to an embodiment of the inventive concepts.

FIG. 5 is a circuit diagram schematically illustrating a memory block BLK1 of a memory cell array shown in FIG. 4, according to an embodiment of the inventive concepts. Referring to FIG. 5, a memory block BLK1 may include a plurality of cell strings. Each of the cell strings may include a string selection transistor connected to a string selection line SSL, a plurality of memory cells respectively connected to a plurality of word lines WL1 to WLn, and a ground selection transistor connected to a ground selection line GSL. In each cell string, the string selection transistor may be connected to a bit line BL, and the ground selection transistor may be connected to a common source line CSL.

Referring to FIG. 5, a group of memory cells connected to a word line (e.g., WLn−1) of n word lines of the memory block BLK1 may be defined as a (n−1)th page. The (n−1)th page may include a plurality of logical pages.

Figure 6:
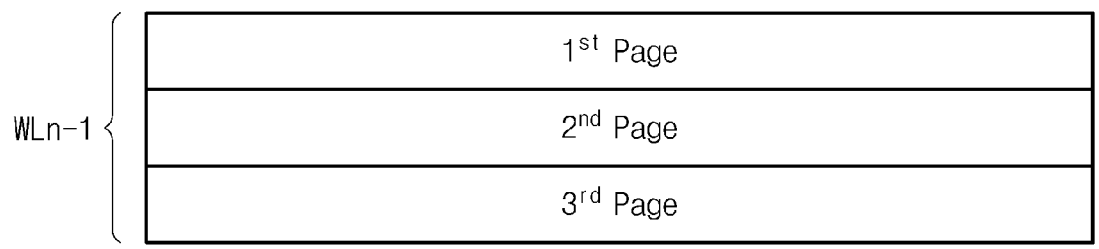
FIG. 6 is a conceptual diagram showing a (n−1)th logical page shown in FIG. 5, according to an embodiment of the inventive concepts.

FIG. 6 is a conceptual diagram showing a (n−1)th logical page shown in FIG. 5, according to an embodiment of the inventive concepts. A 3-bit flash memory may have seven program states and one erase state, and a page may include three logical pages.

Referring to FIG. 6, a (n−1)th page connected to a (n−1)th word line WLn−1 may include first to third logical pages. For example, the first logical page may be an LSB (Least Significant Bit) page, the second logical page may be a CSB (Center Significant Bit) page, and the third logical page may be an MSB (Most Significant Bit) page. Thus, data respectively in the first to third logical pages may form seven program states and one erase state.

Figure 7:
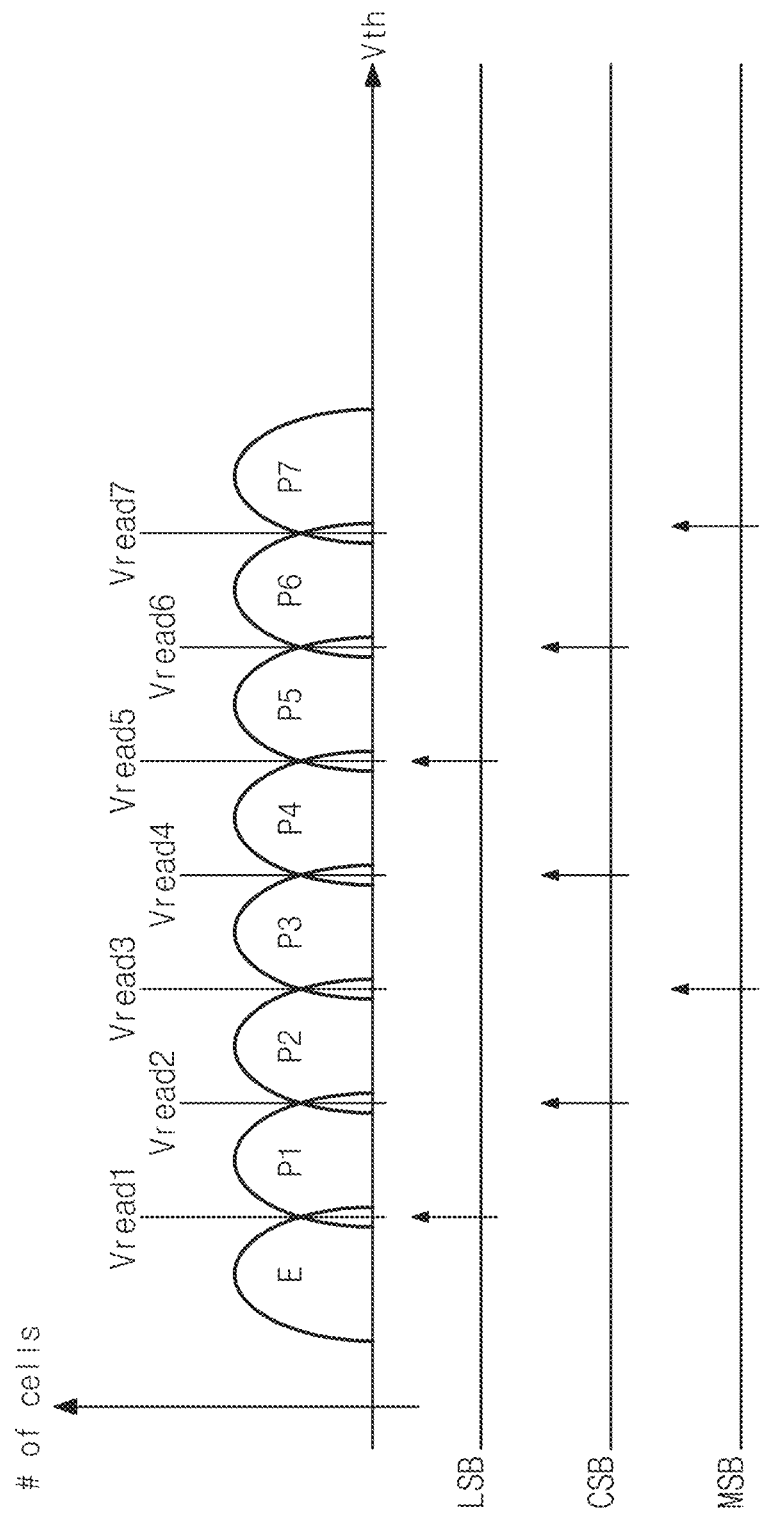
FIG. 7 is a diagram showing program states of a 3-bit flash memory.

FIG. 7 is a diagram showing program states of a 3-bit flash memory.

In case of an MLC flash memory where k bits are programmed at a memory cell, the memory cell may be included in one of $2^k$ threshold voltage distributions.

Threshold voltages of memory cells where the same data is programmed may form a constant range of threshold voltage distribution due to a difference of minute electrical characteristics of memory cells. Threshold voltage distributions may correspond to $2^k$ data values generated by k bits, respectively. In case of a 3-bit flash memory, as illustrated in FIG. 7, seven program states of threshold voltage distributions P1 to P7 and an erase state of threshold voltage distribution E may be formed. A flash memory may read data using first to seventh read voltages Vread1 to Vread7.

Meanwhile, the flash memory may experience a charge loss where electrons trapped at a floating gate or at a tunnel oxide are discharged with the lapse of time. Also, the tunnel oxide may be degraded due to iterative program and erase operations, so the charge loss may become more serious. A threshold voltage may be decreased by the charge loss. That is, a threshold voltage distribution may be shifted toward the left.

Also, a threshold voltage distribution may be increased by program disturbance, erase disturbance, and/or back pattern dependency. Thus, characteristics of memory cells may be deteriorated by the above-described cause, and as illustrated in FIG. 7, threshold voltage distributions respectively corresponding to states E and P1 to P7 may be overlapped.

If threshold voltage distributions are overlapped, data read using a particular read voltage may include a lot of errors. For example, it may be assumed that a flash memory is normal and the read voltage Vread3 is applied. In this case, if a memory cell is turned on, it may have a second program state P2. On the other hand, if the memory cell is turned off, it may have a third program state P3. However, if threshold voltage distributions are overlapped, a memory cell to be read as an off state may be read as an on state. If threshold voltage distributions are overlapped due to a deterioration of memory cells, read data may include a lot of error bits.

In the event that LSB page data is read, the flash memory may perform a read operation two times using the first read voltage Vread1 and the fifth read voltage Vread5. When CSB page data is read, the flash memory may perform a read operation three times using the second read voltage Vread2, the fourth read voltage Vread4, and the sixth read voltage Vread6. To read MSB page data, the flash memory may perform a read operation two times using the third read voltage Vread3 and the seventh read voltage Vread7. The flash memory may provide an ECC engine 1260 (refer to FIG. 2) with results of reading the LSB page, the CSB page, and the MSB page. An ECC decoder 1262 (refer to FIG. 2) may count the number of error bits based on the results provided from the flash memory and may correct error bits.

Figure 8:
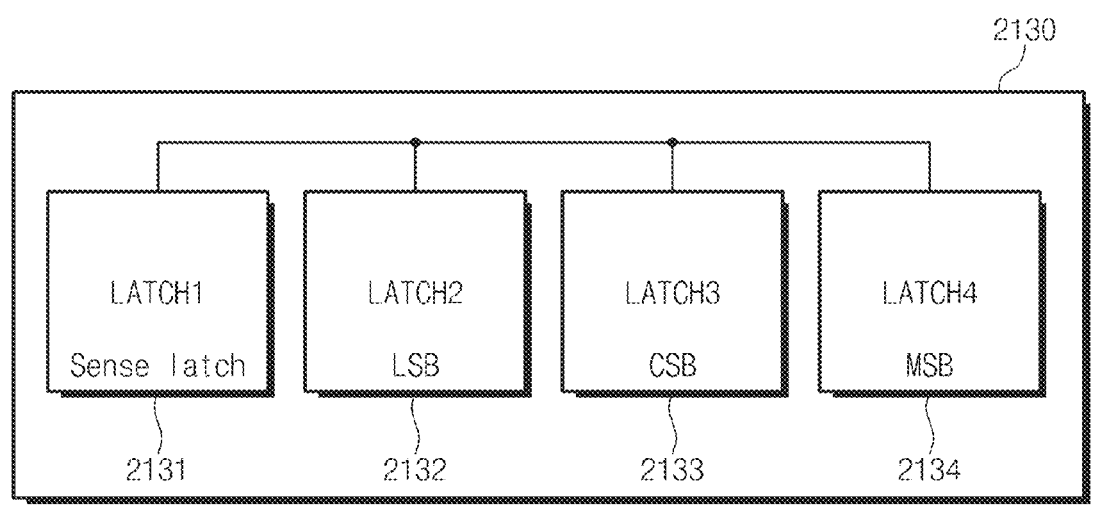
FIG. 8 is a block diagram schematically illustrating a page buffer circuit shown in FIG. 4.

FIG. 8 is a block diagram schematically illustrating a page buffer circuit shown in FIG. 4. Referring to FIG. 8, a page buffer circuit 2130 may include at least one or more latches 2131, 2132, 2133, and 2134. In FIG. 8, there may be illustrated an example in which the page buffer circuit 2130 includes four latches 2131, 2132, 2133, and 2134. However, the inventive concepts are not limited thereto. The four latches 2131, 2132, 2133, and 2134 may be electrically connected.

The first latch 2131 may be a sense latch for sensing data of a memory cell. The second to fourth latches 2132 to 2134 may be data latches for storing original data to be programmed in a flash memory. For example, the second latch 2132 may store LSB data, the second latch 2133 may store CSB data, and the fourth latch 2134 may store MSB data.

The page buffer circuit 2130 may perform an XOR operation through a combination of the first to fourth latches 2131 to 2134 according to a control of control logic 2160. In detail, when read data is LSB data, an XOR operation on the read data and original data may be performed by combining the first latch 2131 and the second latch 2132. If read data is CSB data, an XOR operation on the read data and original data may be performed by combining the first latch 2131 and the third latch 2133.

The page buffer circuit 2130 may provide a result of the XOR operation to a wear leveling index former 2161 included in the control logic 2160 (refer to FIG. 4). The wear leveling index former 2161 may calculate the number of error bits by counting the number of '1' included in the result of the XOR operation. Thus, the wear leveling index former 2161 may calculate an average value or a running average value using the result of the XOR operation provided from the page buffer circuit 2130.

The wear leveling index former 2161 may provide the running average value to a memory controller 2200 (refer to FIG. 3), and the memory controller 2200 may perform a wear leveling operation on the flash memory 2100 based on the running average value.

Figure 9:
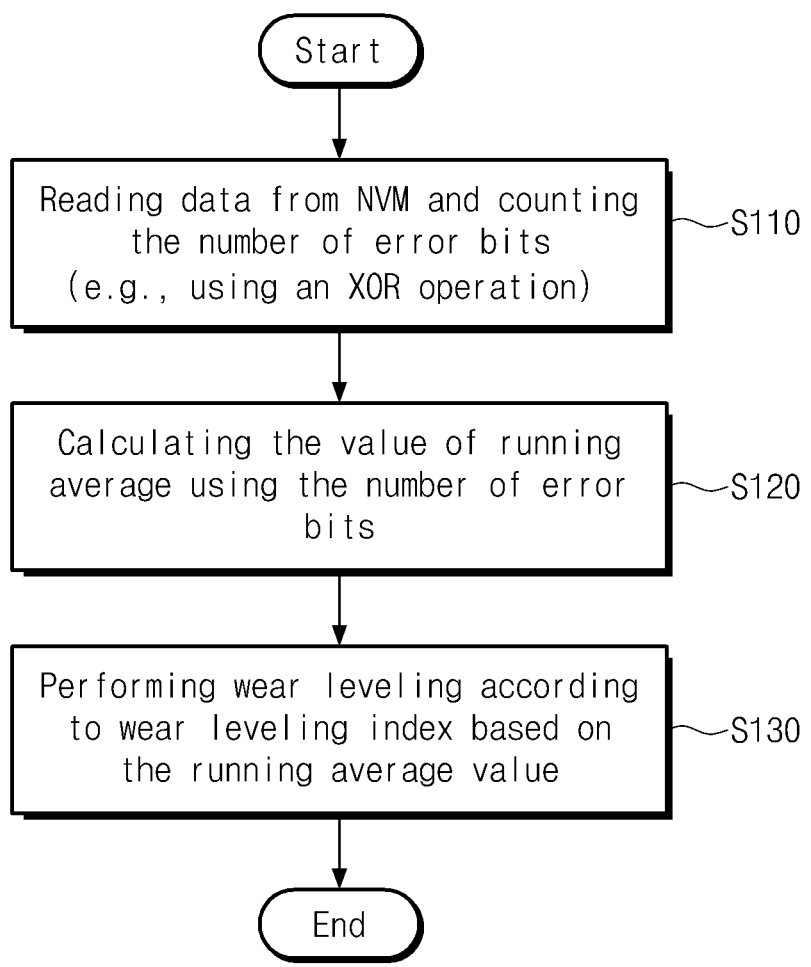
FIG. 9 is a flow chart showing a driving method of a memory controller controlling a nonvolatile memory device according to an embodiment of the inventive concepts.

FIG. 9 is a flow chart showing a driving method of a memory controller controlling a nonvolatile memory device according to an embodiment of the inventive concepts. Below, a driving method of a memory controller 1200 according to an embodiment of the inventive concepts will be more fully described with reference to accompanying drawings.

In step S110, a memory controller 1200 may receive read data from a nonvolatile memory device 1100 and may count the number of error bits of the read data. For example, the memory controller 1200 may include an ECC engine 1260 to count the number of error bits of the read data.

In step S120, the memory controller 1200 may calculate a running average value using the number of error bits. In detail, the memory controller 1200 may include a wear leveling index former 1271, which calculates the running average value using the number of error bits and a noise parameter. The running average value may be used as an index for performing a wear leveling operation.

In step S130, the memory controller 1200 may perform a wear leveling on the nonvolatile memory device 1100 using the running average value. For example, if the running average value is less than a reference value, the memory controller 1200 may perform a wear leveling operation on the nonvolatile memory device 1100 in a direction where a program or erase frequency is increased. If the running average value is greater than the reference value, the memory controller 1200 may perform the wear leveling operation on the nonvolatile memory device 1100 in a direction where a program or erase frequency is decreased.

Figure 10:
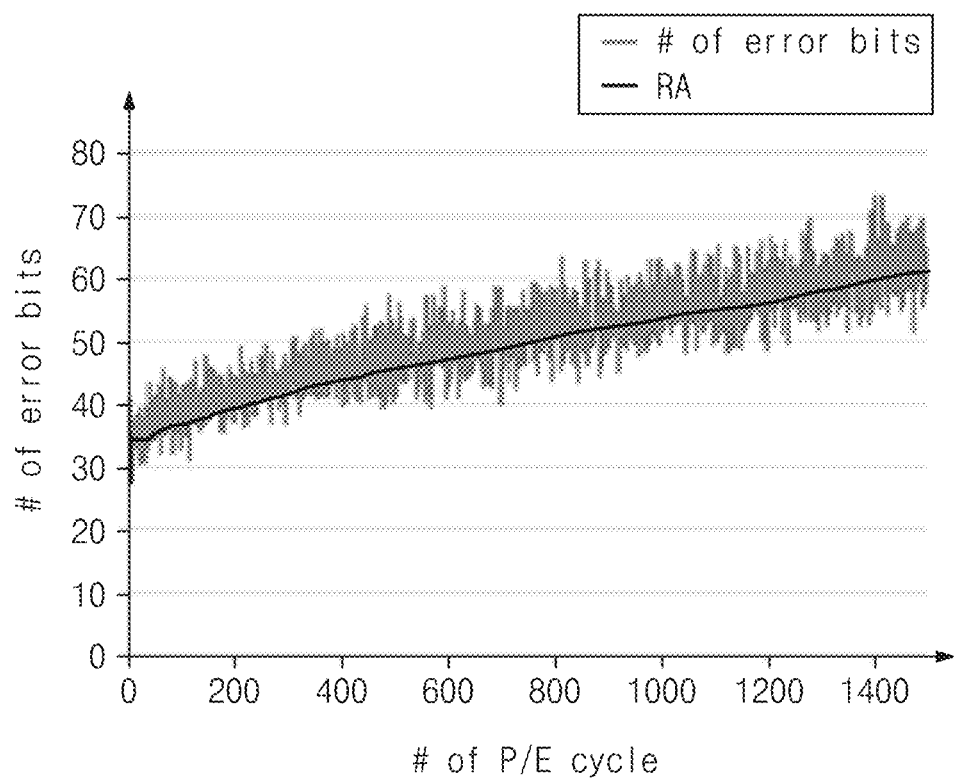
FIG. 10 is a graph showing a running average value used to perform a wear leveling operation of a nonvolatile memory device.

FIG. 10 is a graph showing a running average value used to perform a wear leveling operation of a nonvolatile memory device. Referring to FIG. 10, a horizontal axis may indicate the number of program/erase cycles of a nonvolatile memory device, and a vertical axis may indicate the number of error bits of the nonvolatile memory device. A bold solid line may indicate a running average value RA, and a thin solid line may indicate the number of error bits.

Referring to FIG. 10, a noise may be removed such that there is not almost generated a deviation between error bits corresponding to a program/erase cycle. A running average value RA used as a wear leveling index may be decided by the number of error bits and a noise parameter. If a value of the noise parameter is large, a deviation between error bits corresponding to a program/erase cycle may be decreased, so a noise of the running average value may be decreased.

Figure 11:
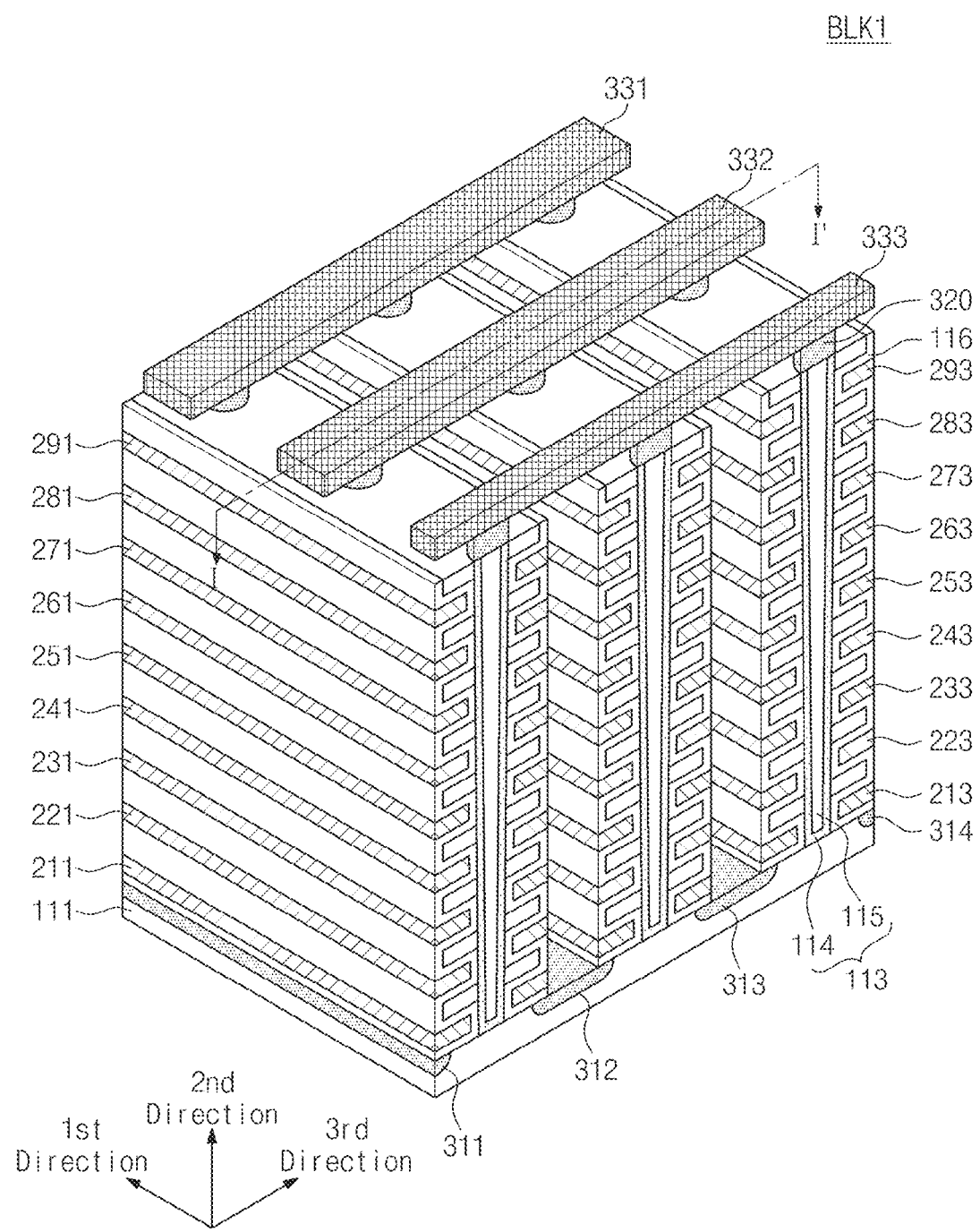
FIGS. 11, 12 and 13 are diagrams schematically illustrating a memory block of a three-dimensional flash memory device shown in FIG. 4.
Figure 12:
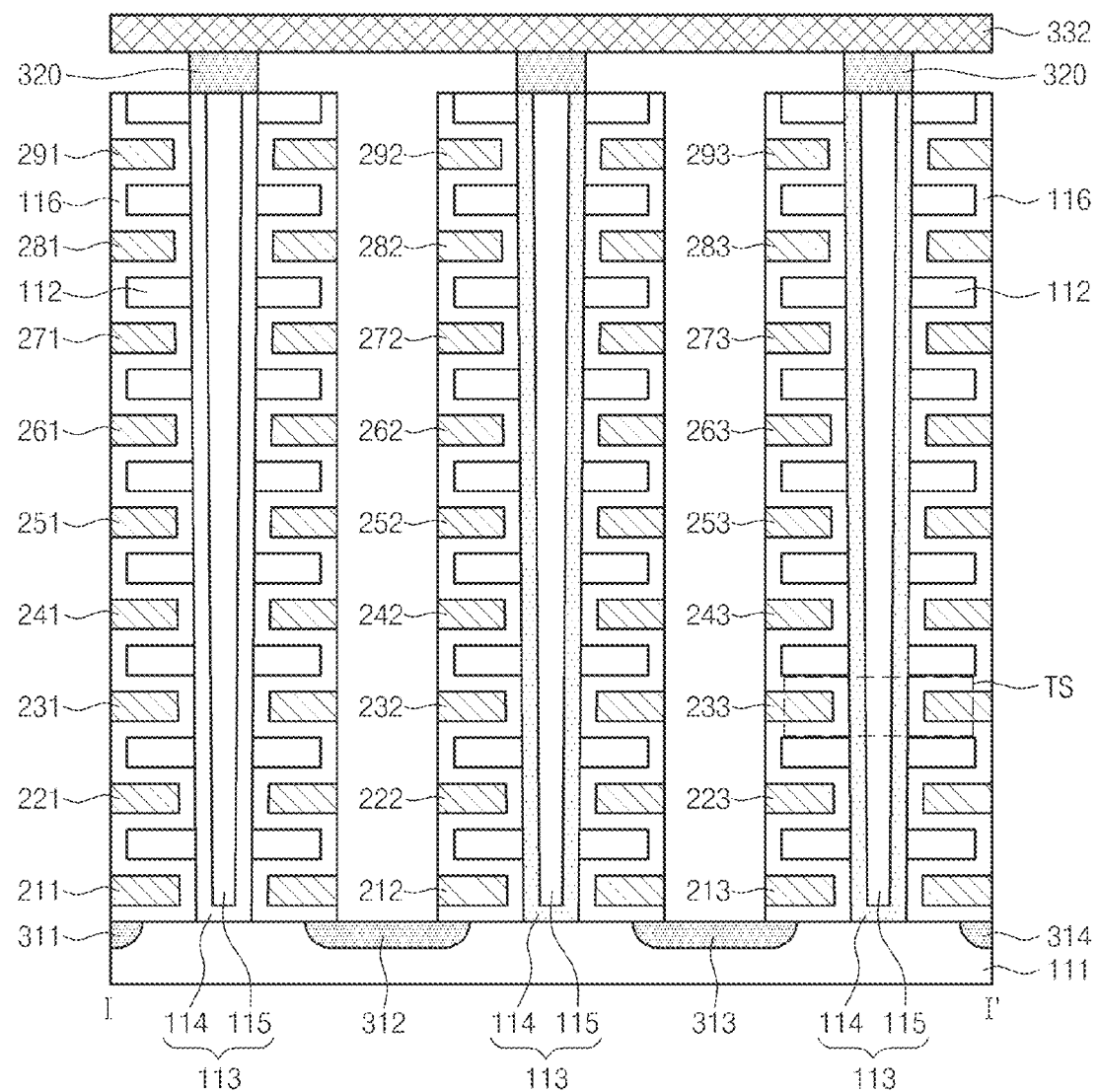
Figure 13:
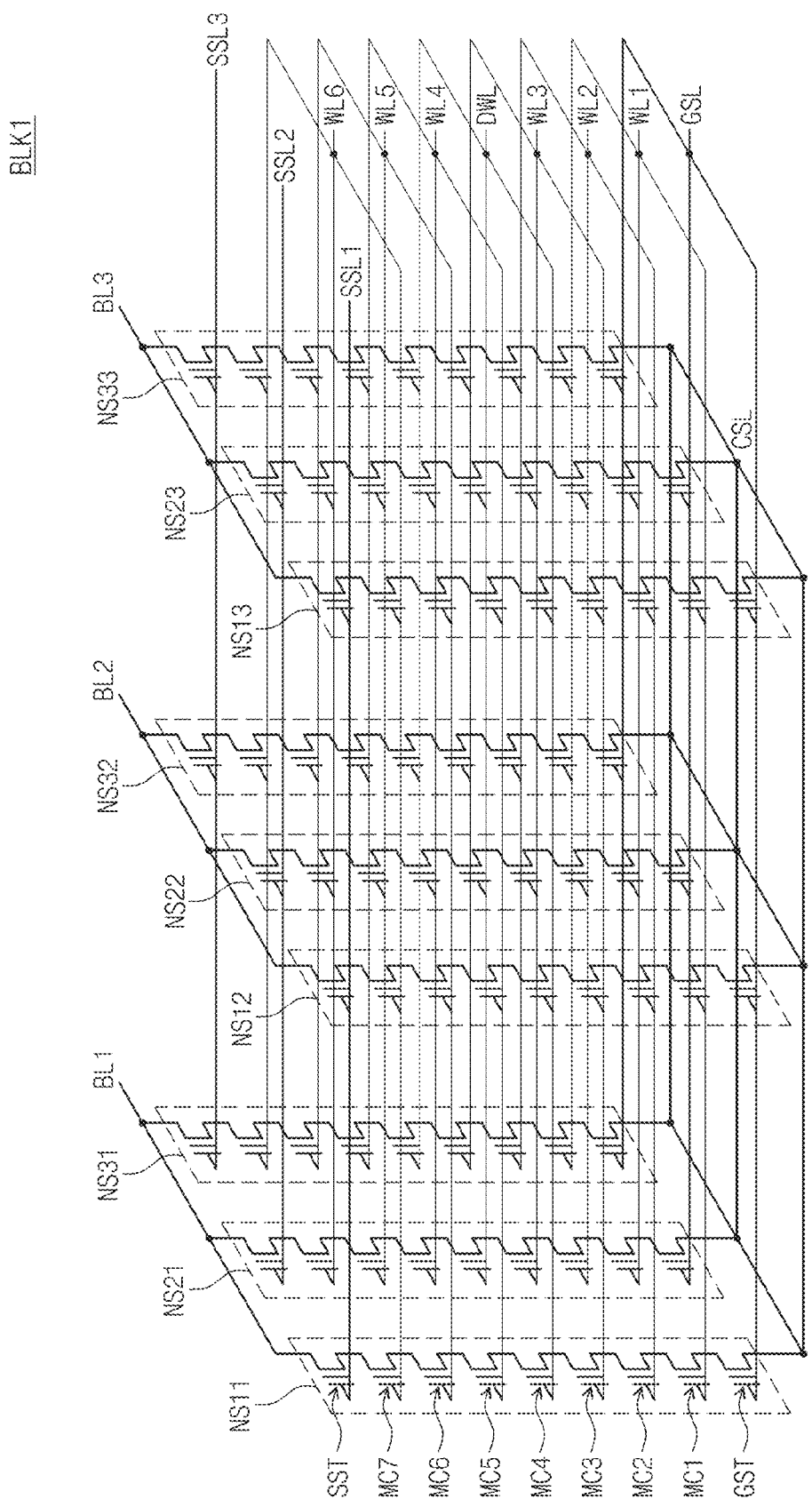

FIGS. 11 to 13 are diagrams schematically illustrating a memory block of a three-dimensional flash memory device shown in FIG. 4. FIG. 11 is a perspective view of one memory block BLK1. FIG. 12 is a cross-sectional view taken along a line I-I' of the memory block BLK1, and FIG. 13 is an equivalent circuit diagram.

Referring to FIGS. 11 and 12, a memory block BLK1 may include structures extending along first to third directions. First, a substrate 111 may be provided. The substrate 111 may include a silicon material doped by a first-type impurity. For example, the substrate 111 may include a silicon material doped by a p-type impurity or may be a p-type well (e.g., a pocket p-well). The substrate 111 may further include an n-type well surrounding the p-type well. Below, it is assumed that the substrate 111 is p-type silicon. However, the substrate 111 is not limited to the p-type silicon.

A plurality of doping regions 311 to 314 extending along the first direction may be provided at the substrate 111. For example, the plurality of doping regions 311 to 314 may have a second type differing from that of the substrate 111. For example, the plurality of doping regions 311 to 314 may be n-type. Below, it is assumed that the first to fourth doping regions 311 to 314 are n-type. However, the first to fourth doping regions 311 to 314 are not limited to the n-type.

A plurality of insulation materials 112 extending along the first direction may be sequentially provided along the second direction over a region of the substrate 111 between the first and second doping regions 311 and 312. For example, the plurality of insulation materials 112 may be provided along the second direction such that they are spaced apart by a predetermined or desired distance. For example, the plurality of insulation materials 112 may be provided to be spaced apart from each other along the second direction. The insulation materials 112 may include an insulator such as silicon oxide.

A plurality of pillars 113 may be sequentially provided on a region of the substrate 111 between the first doping region 311 and the second doping region 312, and may be formed to penetrate the insulation materials 112 along the second direction. Exemplarily, the plurality of pillars 113 may penetrate the insulation materials 112 to contact with the substrate 111.

Each of the pillars 113 may be composed of a plurality of materials. For instance, a surface layer 114 of each pillar 113 may include a silicon material having a first type. For example, the surface layer 114 of each pillar 113 may include a silicon material which is doped with the same type as the substrate 111. Hereinafter, it is assumed that the surface layer 114 of each pillar 113 includes p-type silicon. However, the surface layer 114 of each pillar 113 is not limited to include p-type silicon.

An inner layer 115 of each pillar 113 may be formed of an insulation material. For example, the inner layer 115 of each pillar 113 may be filled with an insulation material such as silicon oxide.

In a region between the first and second doping regions 311 and 312, an insulation layer 116 may be provided along exposed surfaces of the insulation materials 112, the pillars 113, and the substrate 111. Exemplarily, the thickness of the insulation material 116 may be less than a half of the distance between the insulation materials 112. That is, a region, in which any material other than the insulation materials 112 and the insulation layer 116 is disposed, may be provided between the insulation layer 116 provided on an undersurface of the first insulation material of the insulation materials 112 and the insulation layer 116 provided on a top surface of the second insulation material under the first insulation material.

In the region between the first and second doping regions 311 and 312, conductive materials 211 to 291 may be provided on an exposed surface of the insulation layer 116. For example, the conductive material 211 extending along the first direction may be provided between the substrate 111 and the insulation layer 112 adjacent thereto. More specifically, the conductive material 211 extending along the first direction may be provided between the substrate 111 and the insulation layer 116 disposed under the insulation material 112 adjacent to the substrate 111.

A conductive material extending along the first direction may be provided between the insulation layer 116 on a top surface of a specific insulation material among the insulation materials 112 and the insulation layer 116 disposed on an undersurface of an insulation layer provided on a top of the specific insulation material. Also, the conductive material 291 extending along the first direction may be provided on the insulation materials 112. Exemplarily, the conductive materials 211 to 291 extending along the first direction may be a metallic material. Exemplarily, the conductive materials 211 to 291 extending along the first direction may be a conductive material such as polysilicon.

A structure identical to a structure disposed on the first and second doping regions 311 and 312 may be provided in a region between the second and third doping regions 312 and 313. Exemplarily, the plurality of insulation materials 112 extending along the first direction, the plurality of pillars 113 which are sequentially arranged in the first direction and penetrate the plurality of insulation materials 112 in the third direction, the insulation layer 116 provided on exposed surfaces of the plurality of insulation materials 112 and the plurality of pillars 113, and the plurality of conductive materials 212 to 292 extending along the first direction may be provided in the region between the second and third doping regions 312 and 313.

A structure identical to a structure disposed on the first and second doping regions 311 and 312 may be provided in a region between the third and fourth doping regions 313 and 314. Exemplarily, the plurality of insulation materials 112 extending along the first direction, the plurality of pillars 113 which are sequentially arranged in the first direction and penetrate the plurality of insulation materials 112 in the third direction, the insulation layer 116 provided on exposed surfaces of the plurality of insulation materials 112 and the plurality of pillars 113, and the plurality of conductive materials 213 to 293 extending along the first direction may be provided in the region between the third and fourth doping regions 313 and 314

Drains 320 may be respectively provided on the plurality of pillars 113. Exemplarily, the drains 320 may include a silicon material doped with a second type material. For example, the drains 320 may include a silicon material doped with an n-type material. Hereinafter, it is assumed that the drains 320 include a silicon material doped with an n-type material. However, the drains 320 are not limited to include n-type silicon materials. In example embodiments, a width of each drain 320 may be wider than that of a corresponding pillar 113. For example, each drain 320 may be provided on a top surface of the corresponding pillar 113 in a pad shape.

Conductive materials 331 to 333 extending in the third direction may be respectively connected on the drains 320. The conductive materials 331 to 333 may be sequentially disposed along the first direction. The conductive materials 331 to 333 may be respectively connected to the drains 320 in the corresponding region. Exemplarily, the drains 320 and the second conductive material 333 extending along the third direction may be connected to each other through respective contact plugs. Exemplarily, the conductive materials 331 to 333 extending along the third direction may be a metallic material. Exemplarily, the conductive materials 331 to 333 may be a conductive material such as polysilicon.

In FIGS. 11 and 12, each of the pillars 113 may form a string together with an adjacent region of the insulation layer 116 and an adjacent region of the plurality of conductive materials 211 to 291, 212 to 292, and 213 to 293. For example, each pillar 113 may form a NAND string NS together with an adjacent region to the insulation layer 116 and an adjacent region of the first conductive materials 211 to 291, 212 to 292, and 213 to 293 extending along the first direction. The NAND string NS may include a plurality of transistor structures TS. The transistor structure TS will be more fully described with reference to FIG. 16.

In FIGS. 11 and 12, it has been described that the conductive materials 211 to 291, 212 to 292, and 213 to 293 extending along the first direction are provided on nine layers. However, the first conductive materials 211 to 291, 212 to 292, and 213 to 293 extending along the first direction are not limited to being provided on the nine layers. For example, the conductive materials extending along the first direction may be provided upon 8, 16 or more layers. That is, a NAND string may include 8, 16 or more transistors.

In FIGS. 11 and 12, it has been described that three NAND strings are connected to one bit line BL. However, the inventive concept is not limited to such a case that three NAND strings are connected to one bit line BL. Exemplarily, in the memory block BLK1, m NAND strings may be connected to one bit line BL. Here, the number of the conductive materials 211 to 291, 212 to 292, and 213 to 293 extending along the first direction and the number of first through fourth doping regions 311 to 314 may also be adjusted so as to correspond to the number of NAND strings connected to one bit line BL.

In FIGS. 11 and 12, it has been described that three NAND strings NS are connected to one conductive material extending along the first direction. However, the inventive concept is not limited to such a case that three NAND strings NS are connected to a conductive material. For example, n NAND strings NS may be connected to one conductive material. Here, the number of the conductive materials 331 to 333 extending along the third direction may also be adjusted to correspond to the number of NAND strings NS connected to one conductive material.

FIG. 13 is an equivalent diagram of a memory block BLK1 described with reference to FIGS. 11 and 12. Referring to FIGS. 11 to 13, NAND strings NS11 to NS31 may be provided between a first bit line BL1 and a common source line CSL. NAND strings NS12, NS22 and NS32 may be provided between a second bit line BL2 and the common source line CSL. NAND strings NS13, NS23 and NS33 may be provided between a third bit line BL3 and the common source line CSL. The third bit line BL3 may correspond to a conductive material 333 extending along a third direction.

A string selection transistor SST of each NAND string NS may be connected to a corresponding bit line BL. A ground selection transistor GST of each NAND string NS may be connected to the common source line CSL. Memory cells MC may be provided between the string selection transistor SST and the ground selection transistor GST of each NAND string NS. Hereinafter, the NAND strings NS may be defined in units of rows and columns. The NAND strings NS commonly connected to one bit line may form one column. For example, the NAND strings NS11 to NS 31 connected to the first bit line BL1 may correspond to a first column. The NAND strings NS12 to NS 32 connected to the second bit line BL2 may correspond to a second column. The NAND strings NS13 to NS 33 connected to the third bit line BL3 may correspond to a third column. The NAND strings NS connected to one string selection line SSL may form one row. For example, the NAND strings NS11 to NS13 connected to a first string selection line SSL1 may form a first row. The NAND strings NS21 to NS23 connected to a second string selection line SSL2 may form a second row. The NAND strings NS31 to NS33 connected to a third string selection line SSL3 may form a third row.

A height may be defined in each NAND string NS. Exemplarily, the height of the ground selection transistor GST may be defined as 1 in each NAND string NS. In each NAND string NS, the closer to the string selection transistor SST, the higher the height of a memory cell. In each NAND string NS, the height of the memory cell MC7 adjacent to the string selection transistor SST may be defined as 7.

The string selection transistors SST of the NAND strings NS of the same row may share the string selection line SSL. The string selection transistors SST of the NAND strings NS in different rows may be connected with different string selection lines SSL1, SSL2, and SSL3, respectively.

The memory cells MC having the same height in the NAND strings NS of the same row may share the word line WL. The word lines WL of the NAND strings NS which have the same height and correspond to different rows may be commonly connected. Ground selection transistors GST of the NAND strings NS of the same row may share the ground selection line GSL. Ground selection transistors GST of the NAND strings NS of different rows may share the ground selection line GSL. That is, the NAND strings NS11 to NS13, NS21 to NS23, and NS31 to NS33 may be connected in common to the ground selection line GSL.

As illustrated in FIG. 13, the word lines WL having the same height may be commonly connected. Therefore, when the word line WL with a specific height is selected, all of the NAND strings NS connected to the selected word line WL may be selected. The NAND strings NS of different rows may be connected to different string selection lines SSL. Accordingly, among the NAND strings NS connected to the same word line WL, the NAND strings NS of the unselected row may be electrically isolated from the bit lines BL1 to BL3. That is, a row of the NAND strings NS may be selected by selecting the string selection lines SSL1 to SSL3. The NAND strings NS of the selected row may be selected by the column unit by selecting the bit lines BL1 to BL3.

Figure 14:
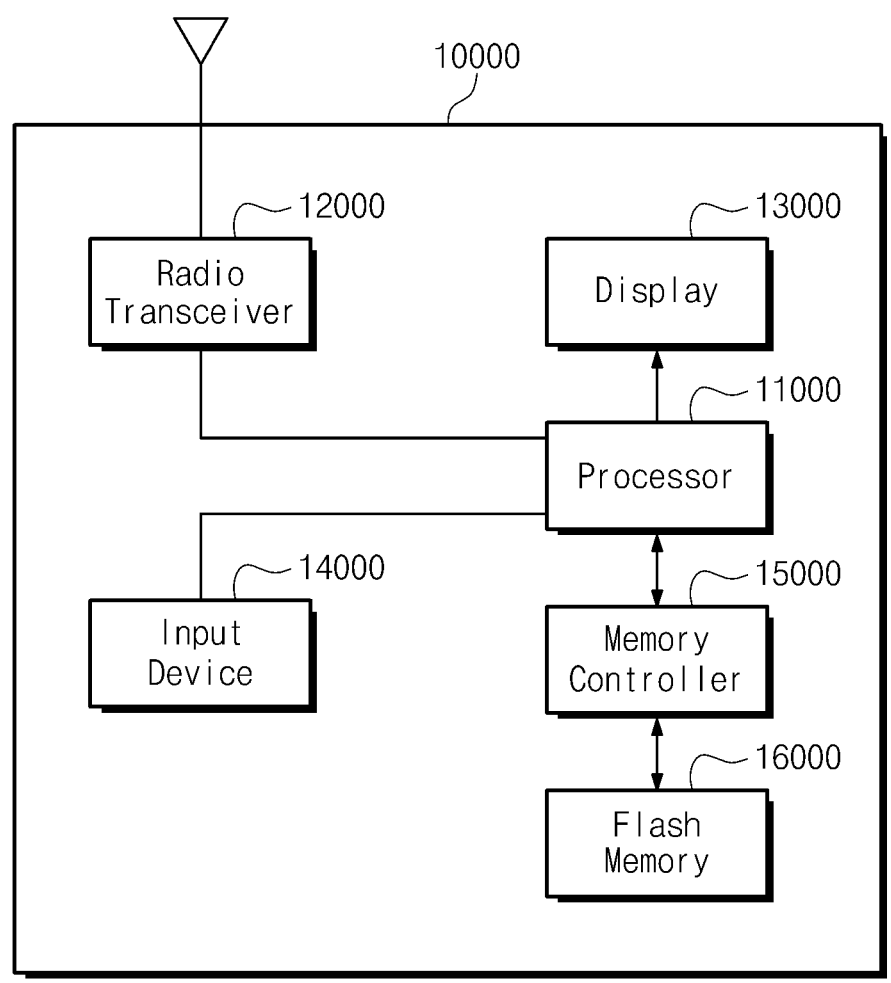
FIG. 14 is a block diagram schematically illustrating an electronic device including a memory controller and a nonvolatile memory device, according to an embodiment of the inventive concept.

FIG. 14 is a block diagram schematically illustrating an electronic device 10000 including a memory controller 15000 and a nonvolatile flash memory 16000, according to an embodiment of the inventive concept. Referring to FIG. 14, an electronic device 10000 such as a cellular phone, a smart phone, or a tablet PC may include a nonvolatile flash memory 16000 and a memory controller 15000 to control the flash memory 16000.

The flash memory 16000 may be a nonvolatile memory device 1100 shown in FIG. 1. The memory controller 15000 may be controlled by a processor 11000 which controls an overall operation of the electronic device 10000. Data stored at the flash memory 16000 may be displayed through a display 13000 according to a control of the memory controller 15000 which operates according to a control of the processor 11000.

A radio transceiver 12000 may change a radio signal through an antenna. For example, the radio transceiver 12000 may convert a radio signal received through the antenna into a signal capable of being processed by the processor 11000. Thus, the processor 11000 may process a signal from the radio transceiver 12000, and may store the processed signal at the flash memory 16000. Or, the processor 11000 may display the processed signal through the display 13000.

The radio transceiver 12000 may convert a signal from the processor 11000 into a radio signal, and may output the converted radio signal to the exterior through the antenna. An input device 14000 may be a device that receives a control signal for controlling an operation of the processor 11000 or data to be processed by the processor 11000, and may be implemented by a pointing device such as a touch pad or a computer mouse, a key pad, or a keyboard.

The processor 11000 may control the display 13000 such that data from the nonvolatile memory device 16000, a radio signal from the radio transceiver 12000 or data from the input device 14000 is displayed through the display 13000.

Figure 15:
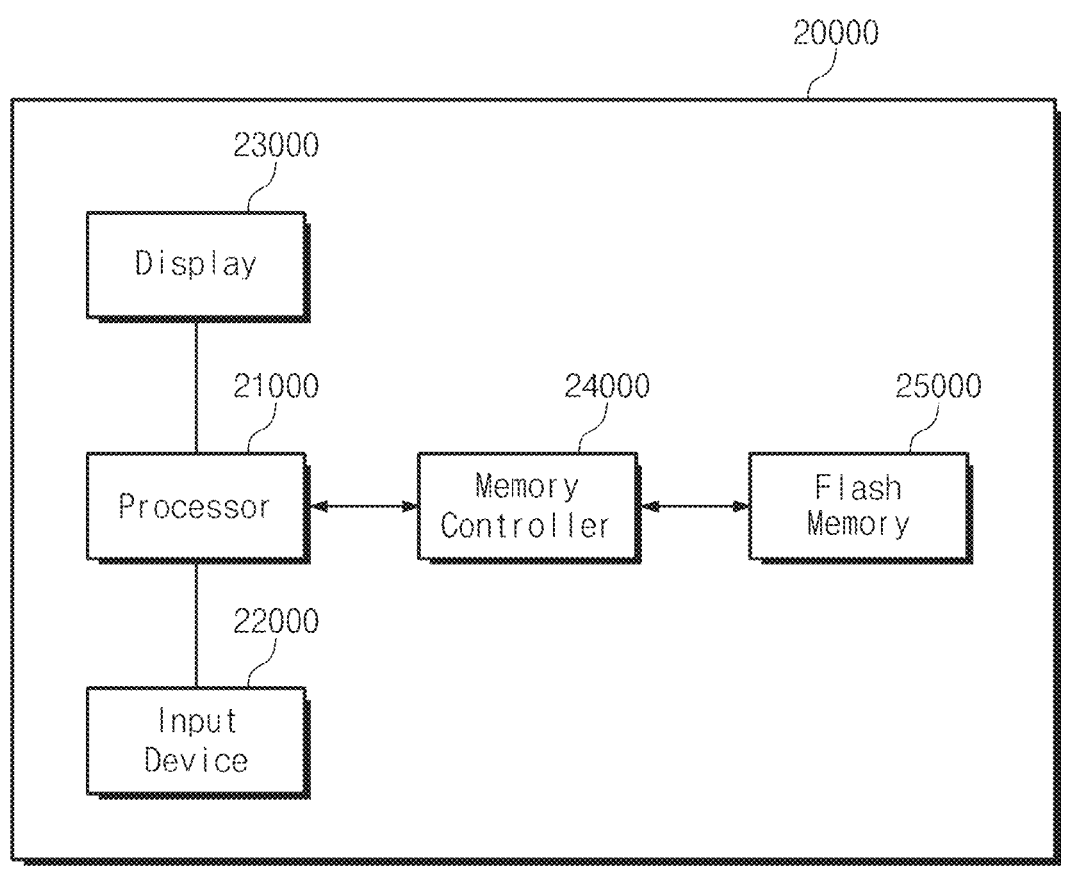
FIG. 15 is a block diagram schematically illustrating an electronic device including a memory controller and a flash memory, according to another embodiment of the inventive concept.

FIG. 15 is a block diagram schematically illustrating an electronic device 20000 including a memory controller 24000 and a flash memory 25000, according to another embodiment of the inventive concept.

Referring to FIG. 15, an electronic device 20000 may be implemented by a data processing device such as a personal computer, a tablet computer, a net-book, an e-reader, a PDA (Personal Digital Assistant), a PMP (Portable Multimedia Player), an MP3 player, or an MP4 player, and may include a flash memory 25000 and a memory controller 24000 to control an operation of the flash memory 25000.

The electronic device 20000 may include a processor 21000 to control an overall operation of the electronic device 20000. The memory controller 24000 may be controlled by the processor 21000. The processor 21000 may display data stored at the flash memory 25000 through a display 23000 according to an input signal generated by an input device 22000. For example, the input device 22000 may be implemented by a pointing device such as a touch pad or a computer mouse, a key pad, or a keyboard.

Figure 16:
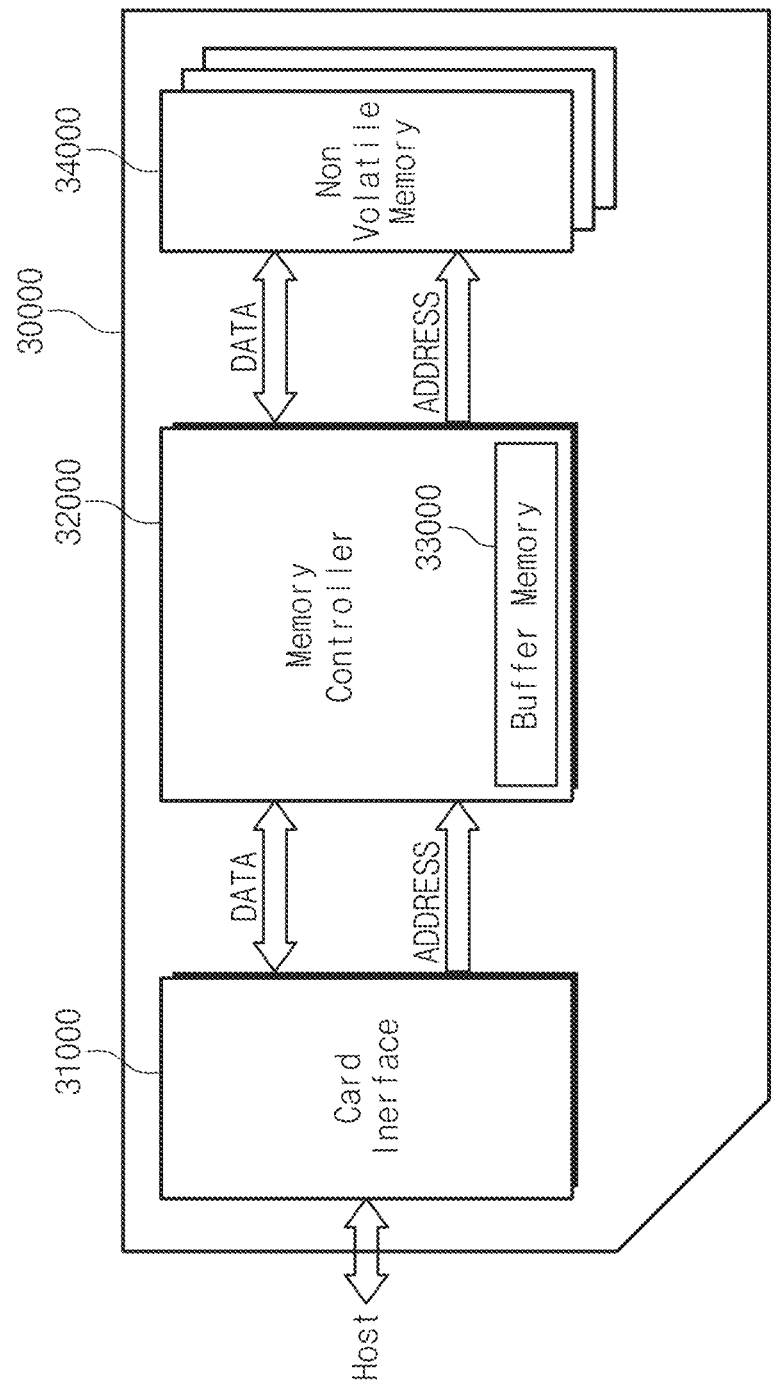
FIG. 16 is a block diagram schematically illustrating an electronic device including a nonvolatile memory device, according to still another embodiment of the inventive concept.

FIG. 16 is a block diagram schematically illustrating an electronic device 30000 including a nonvolatile memory device 34000, according to still another embodiment of the inventive concept. Referring to FIG. 16, an electronic device 30000 may include a card interface 31000, a memory controller 32000, and a nonvolatile memory device 34000 (e.g., a flash memory device).

The electronic device 30000 may exchange data with a host through the card interface 31000. The card interface 31000 may be an SD (Secure Digital) card interface or an MMC (Multi-Media Card) interface. However, the inventive concept is not limited thereto. The card interface 31000 may interface data exchange between the host and the memory controller 32000 according to the communications protocol of the host capable of communicating the electronic device 30000.

The memory controller 32000 may control an overall operation of the electronic device 30000, and may control exchange of data between the card interface 31000 and the nonvolatile memory device 34000. A buffer memory 33000 of the memory controller 32000 may buffer data transferred between the card interface 31000 and the nonvolatile memory device 34000.

The memory controller 32000 may be connected with the card interface 31000 and the nonvolatile memory device 34000 through a data bus DATA and an address bus ADDRESS. According to an embodiment, the memory controller 32000 may receive an address of data to be read or written from the card interface 31000 through the address bus ADDRESS, and may send it to the nonvolatile memory device 34000.

Also, the memory controller 32000 may receive or transfer data to be read or written through the data bus DATA connected with the card interface 31000 or the nonvolatile memory device 34000.

When the electronic device 30000 is connected with a host such as a PC, a tablet PC, a digital camera, a digital audio player, a mobile phone, console video game hardware or a digital set-top box, the host may exchange data stored at the nonvolatile memory device 34000 through the card interface 31000 and the memory controller 32000.

Figure 17:
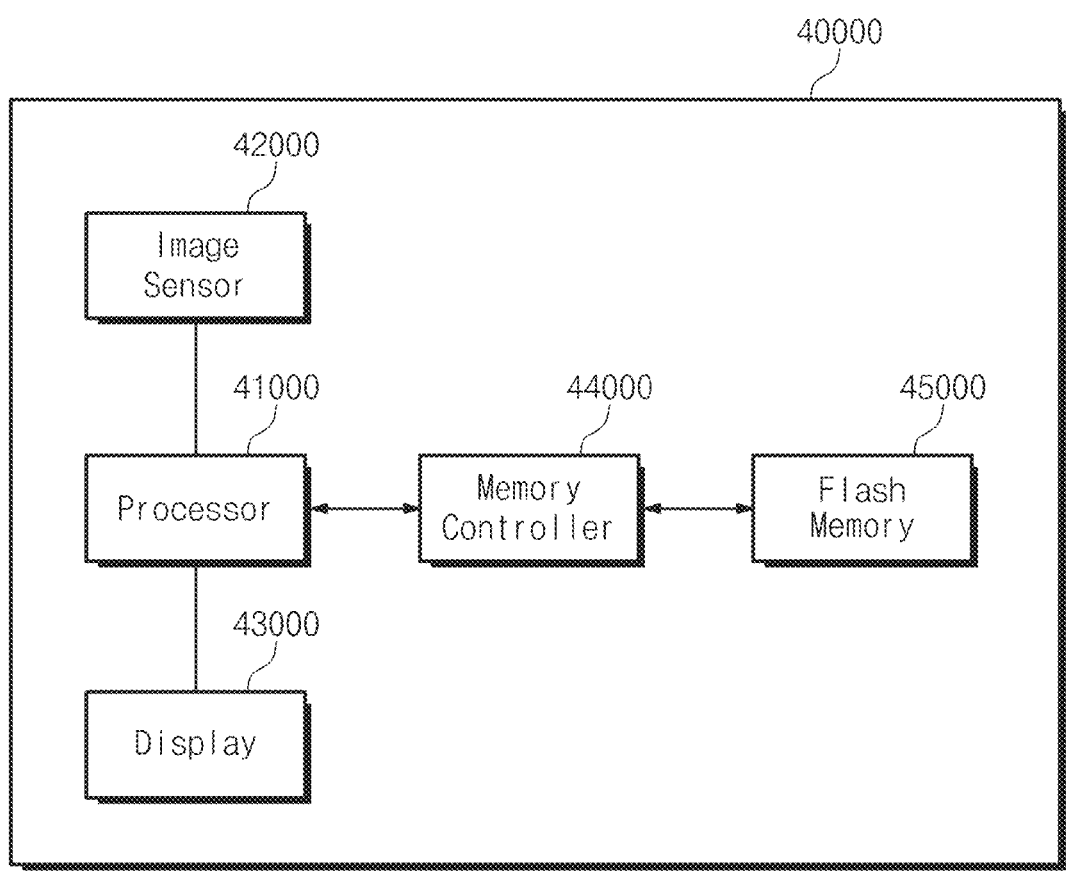
FIG. 17 is a block diagram schematically illustrating an electronic device including a memory controller and a flash memory, according to still another embodiment of the inventive concept.

FIG. 17 is a block diagram schematically illustrating an electronic device including a memory controller and a flash memory, according to still another embodiment of the inventive concept.

Referring to FIG. 17, an electronic device 40000 may include a nonvolatile flash memory 45000, a memory controller 44000 to control a data processing operation of the nonvolatile flash memory 45000, and a processor 41000 to control an overall operation of the electronic device 40000. An image sensor 42000 of the electronic device 40000 may convert an optical signal into a digital signal, and the converted digital signal may be stored at the nonvolatile flash memory 45000 under the control of the processor 41000. Or, the converted digital signal may be displayed through a display 43000 under the control of the processor 41000.

Figure 18:
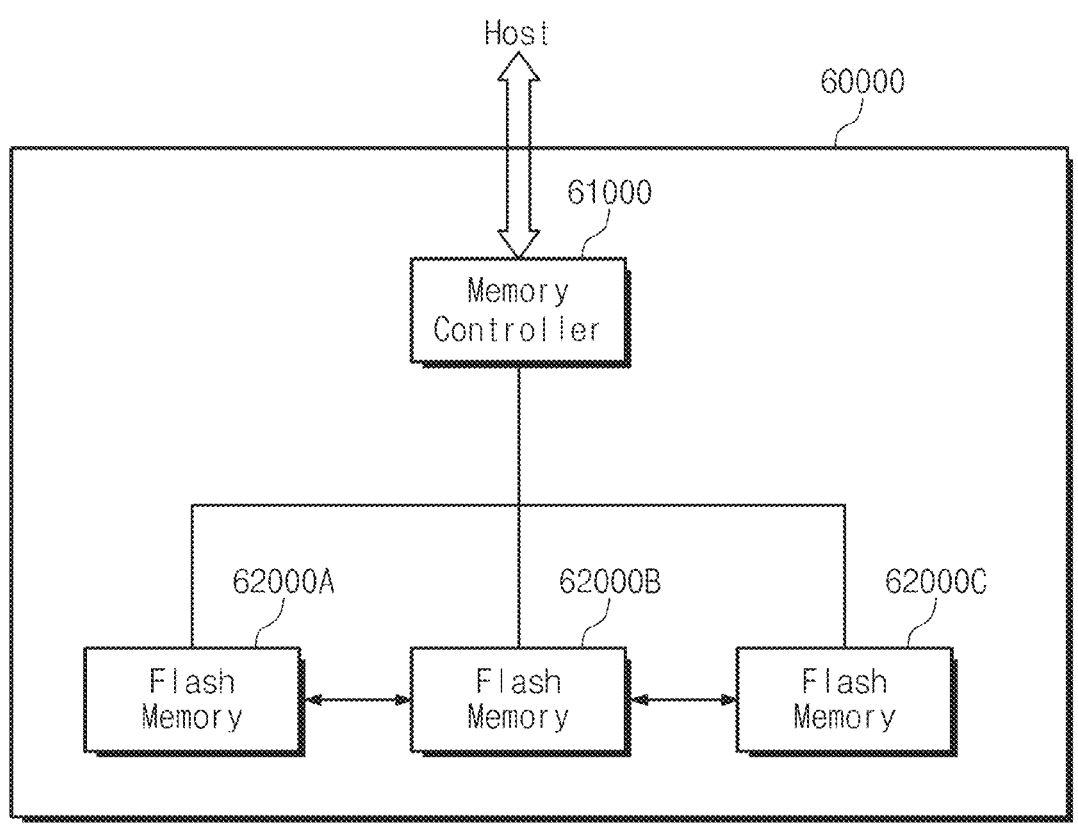
FIG. 18 is a block diagram schematically illustrating an electronic device 60000 including a memory controller and nonvolatile memory devices, according to still another embodiment of the inventive concept.

FIG. 18 is a block diagram schematically illustrating an electronic device 60000 including a memory controller 61000 and nonvolatile memory devices 62000A, 62000B, and 62000C, according to still another embodiment of the inventive concept. Referring to FIG. 18, an electronic device 60000 may be implemented by a data storage device such as a solid state drive (SSD).

The electronic device 60000 may include a plurality of flash memories 62000A, 62000B, and 62000C and a memory controller 61000 to control a data processing operation of each of the flash memories 62000A, 62000B, and 62000C. The electronic device 60000 may be implemented by a memory system or a memory module. The memory controller 61000 may be implemented outside or inside electronic device 60000 according to an embodiment.

Figure 19:
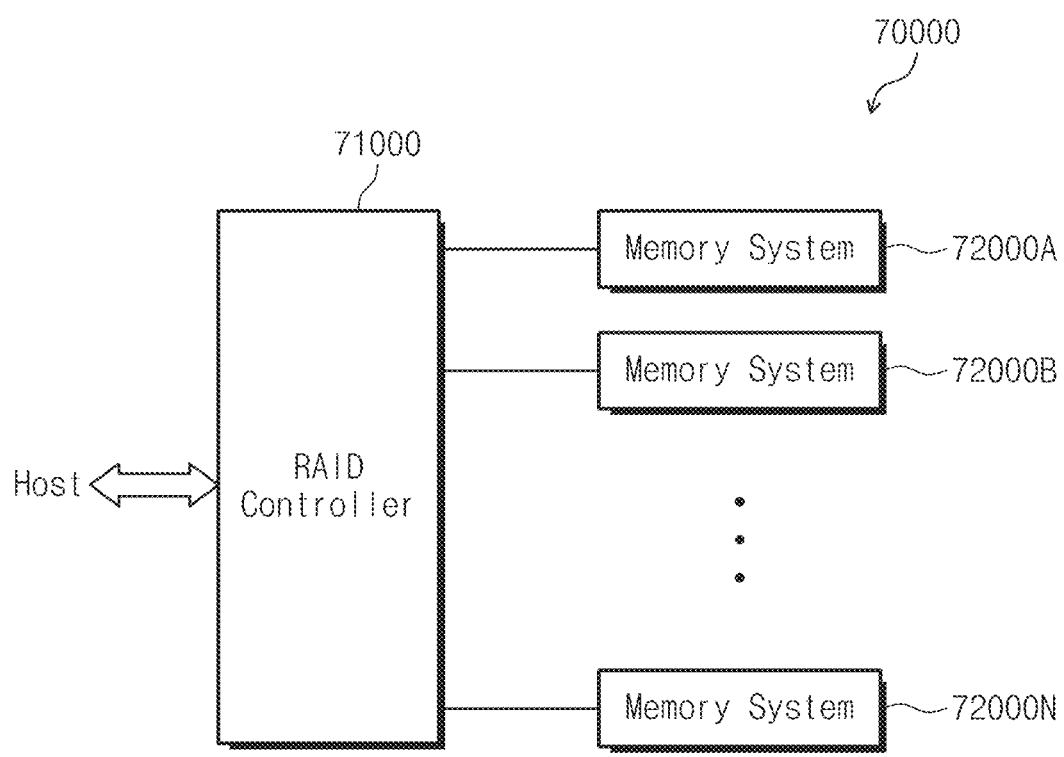
FIG. 19 is a block diagram of a data processing system including an electronic device shown in FIG. 18.

FIG. 19 is a block diagram of a data processing system including an electronic device shown in FIG. 18. Referring to FIGS. 18 and 19, a data storage device 70000 may be implemented by a RAID (Redundant Array of Independent Disks) system. The data storage device 70000 may include a RAID controller 71000 and a plurality of memory systems 72000A to 72000N (N being a natural number).

Each of the memory systems 72000A to 72000N may be an electronic device 60000 shown in FIG. 18. The memory systems 72000A to 72000N may form an RAID array. The data storage device 70000 may be implemented by a personal computer or an SSD.

During a program operation, the RAID controller 71000 may output program data output from a host to one of the memory systems 72000A to 72000N according to one selected from a plurality of RAID levels based on RAID level information output from the host.

RAID controller 71000 may transfer data read from one of the memory systems 72000A to 72000N to the host according to one selected from a plurality of RAID levels based on RAID level information output from the host.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of driving a memory controller which is configured to control a nonvolatile memory device, the method comprising:
    counting a number of error bits of read data provided from the nonvolatile memory device;
    determining a running average value using a number of error bits and a noise parameter; and
    performing wear leveling on the nonvolatile memory device using the running average value as a wear leveling index, wherein:
    a noise of the running average value is decreased, as the noise parameter is increased, and
    wherein the noise parameter is increased according to an increase in a program/erase cycle of the nonvolatile memory device.

2. The method of claim 1, wherein when the running average value is less than a reference value, a wear leveling operation on the nonvolatile memory device is performed such that a program or erase frequency is increased.

3. The method of claim 1, wherein when the running average value is greater than a reference value, a wear leveling operation on the nonvolatile memory device is performed such that a program or erase frequency is decreased.

4. The method of claim 1, wherein the memory controller comprises an ECC decoder configured to count the number of error bits.

5. The method of claim 4, wherein:
    the memory controller further comprises a wear leveling index former,
    the ECC decoder counts the number of error bits and provides the number of error bits to the wear leveling index former, and
    the wear leveling index former determines the running average value using the number of error bits.

6. A nonvolatile memory device comprising:
    a memory cell array including a plurality of memory blocks storing data;
    a page buffer circuit connected to the memory cell array through bit lines and including a sense latch to sense and store data read from the memory cell array; and
    a control logic configured to control the page buffer circuit, wherein:
    the control logic comprises:
        a wear leveling index former which counts a number of error bits of read data based on a result of a comparison between the read data stored in the sense latch and original data, determines a running average value using the number of error bits and a noise parameter, and forms wear leveling indexes of the plurality of memory blocks,
    a noise of the running average value is decreased, as the noise parameter is increased, and
    the noise parameter is increased according to an increase in a program/erase cycle of the nonvolatile memory device.

7. The nonvolatile memory device of claim 6, wherein when the running average value is less than a reference value, a program or erase frequency of a memory block corresponding to the running average value is decreased.

8. The nonvolatile memory device of claim 6, wherein when the running average value is greater than a reference value, a program or erase frequency of a memory block corresponding to the running average value is increased.

9. The nonvolatile memory device of claim 6, wherein the page buffer circuit further comprises at least one data latch configured to store the original data.

10. The nonvolatile memory device of claim 9, wherein the page buffer circuit performs an XOR operation using the at least one data latch and the sense latch, and provides the result of the XOR operation to the wear leveling index former.

11. The nonvolatile memory device of claim 10, wherein the wear leveling index former determines a number of error bits by counting a number of one-bits in the result of the XOR operation.

12. A memory controller comprising:
    a microprocessor configured to control and interpret a program or read command to be provided to a nonvolatile memory device;
    an ECC decoder configured to count a number of error bits of data read from the nonvolatile memory device under a control of the microprocessor; and
    a wear leveling control unit configured to determine a running average value using a number of error bits and a noise parameter, and to perform wear leveling of the nonvolatile memory device according to the running average value, wherein:
    a noise of the running average value is decreased, as the noise parameter is increased, and
    the noise parameter is increased according to an increase in a program/erase cycle of the nonvolatile memory device.

13. The memory controller of claim 12, wherein the wear leveling control unit determines a number of program/erase cycles of the nonvolatile memory device using the running average value as a wear leveling index.

14. The memory controller of claim 12, wherein when the running average value is less than a reference value, a wear leveling frequency of a memory block corresponding to the running average value is decreased.

15. The memory controller of claim 12, wherein when the running average value is greater than a reference value, a wear leveling frequency of a memory block corresponding to the running average value is increased.

16. The memory controller of claim 12, wherein the wear leveling control unit is configured to perform an operation under control of the microprocessor.

17. The memory controller of claim 12, further comprising an ECC encoder configured to encode data to be provided to the nonvolatile memory device.

* * * * *